US010454421B2

United States Patent
Nicholls

(10) Patent No.: US 10,454,421 B2
(45) Date of Patent: Oct. 22, 2019

(54) OPTOELECTRONIC OSCILLATOR WITH TUNABLE FILTER

(71) Applicant: NANOWAVE TECHNOLOGIES INC., Etobicoke (CA)

(72) Inventor: Charles William Tremlett Nicholls, Ottawa (CA)

(73) Assignee: NANOWAVE TECHNOLOGIES INC., Etobicoke (CA)

( * ) Notice: Subject to any disclaimer, the term of this patent is extended or adjusted under 35 U.S.C. 154(b) by 52 days.

(21) Appl. No.: 15/752,797

(22) PCT Filed: Aug. 19, 2016

(86) PCT No.: PCT/CA2016/050975
§ 371 (c)(1),
(2) Date: Feb. 14, 2018

(87) PCT Pub. No.: WO2017/031575
PCT Pub. Date: Mar. 2, 2017

(65) Prior Publication Data
US 2018/0248518 A1 Aug. 30, 2018

Related U.S. Application Data

(60) Provisional application No. 62/356,900, filed on Jun. 30, 2016, provisional application No. 62/208,111, filed on Aug. 21, 2015.

(51) Int. Cl.
*H03B 5/00* (2006.01)
*H03B 17/00* (2006.01)
(Continued)

(52) U.S. Cl.
CPC ........... *H03B 17/00* (2013.01); *G02F 1/2252* (2013.01); *G02F 2/02* (2013.01); *H03H 9/6406* (2013.01);
(Continued)

(58) Field of Classification Search
CPC ...................................................... H03B 17/00
(Continued)

(56) References Cited

U.S. PATENT DOCUMENTS 7,184,451 B2   2/2007   Ilchenko et al.
8,659,814 B2 * 2/2014   Matsko .................. G02F 1/395
                                                           359/239
(Continued)

FOREIGN PATENT DOCUMENTS

EP   1600806 A2   11/2005
EP   2890004 A1   7/2015
(Continued)

OTHER PUBLICATIONS

European Patent Application No. 16838153.1, Partial Supplementary European Search Report dated Mar. 20, 2019.
(Continued)

*Primary Examiner* — Joseph Chang
(74) *Attorney, Agent, or Firm* — Borden Ladner Gervais LLP; Curtis B. Behmann

(57) ABSTRACT

An optoelectronic oscillator (OEO) is disclosed comprising an electronically tunable filter for transposing narrow pass band characteristics of a surface acoustic wave (SAW) filter to a microwave frequency to provide mode selection in the OEO. An OEO is disclosed comprising a set of optical domain components, a downconverter in communication with an output of the optical domain components, and a set of radio frequency (RF) domain components in communication with an output of the downconverter. The set of RF domain components comprises a tunable filter operating at a filter center frequency and having an output coupled to the set of optical domain components for communicating a mode selection result. The tunable filter including a tuner; and a sub-filter. The sub-filter operating at a fixed center
(Continued)

frequency to provide mode selection and adjacent mode suppression with respect to the tunable filter center frequency. The sub-filter center frequency being lower than the tunable filter center frequency, and a ratio of the tunable filter center frequency to a bandwidth of the sub-filter being at least 1000:1.

21 Claims, 20 Drawing Sheets

(51) Int. Cl.
| | |
|---|---|
| G02F 2/02 | (2006.01) |
| G02F 1/225 | (2006.01) |
| H03H 9/64 | (2006.01) |
| H03J 3/28 | (2006.01) |
| G01S 7/292 | (2006.01) |
| G01S 13/524 | (2006.01) |
| G02F 1/21 | (2006.01) |
| H01P 7/06 | (2006.01) |
| H01P 7/10 | (2006.01) |

(52) U.S. Cl.
CPC ............... *H03J 3/28* (2013.01); *G01S 7/292* (2013.01); *G01S 13/524* (2013.01); *G02F 2001/212* (2013.01); *G02F 2201/205* (2013.01); *H01P 7/06* (2013.01); *H01P 7/10* (2013.01); *H03B 2200/009* (2013.01); *H03B 2200/0044* (2013.01); *H03B 2200/0048* (2013.01)

(58) Field of Classification Search
USPC .......................................................... 331/66
See application file for complete search history.

(56) References Cited

U.S. PATENT DOCUMENTS

| | | |
|---|---|---|
| 2003/0160148 A1 | 8/2003 | Yao et al. |
| 2014/0186045 A1 | 7/2014 | Poddar et al. |

FOREIGN PATENT DOCUMENTS

| | | |
|---|---|---|
| JP | 2009157044 A | 7/2009 |
| WO | 2014161062 A1 | 10/2014 |

OTHER PUBLICATIONS

International Patent Application No. PCT/CA2016/050975, International Preliminary Report on Patentability dated Mar. 8, 2018.
International Patent Application No. PCT/CA2016/050975, International Search Report and Written Opinion dated Oct. 12, 2016.
Li et al., "A Wideband Frequency Tunable Optoelectronic Oscillator Incorporating a Tunable Microwave Photonic Filter Based on Phase-Modulation to Intensity-Modulation Conversion Using a Phase-Shifted Fiber Bragg Grating," in IEEE Transactions on Microwave Theory and Techniques, Jun. 2012, vol. 60 (6), pp. 1735-1742.
Tang et al., "Photonic Microwave Downconverter Based on an Optoelectronic Oscillator using a Single Dual-Drive Mach-Zehnder Modulator", Key Laboratory of Radar Imaging and Microwave Photonics (Nanjing Univ. Aeronaut. Astronaut.), Ministry of Education, Nanjing University of Aeronautics and Astronautics, Nanjing, 210016, China, May 2013, whole document, retrieved online on Oct. 6, 2016, vol. 22 (1), pp. 305-310 from:https://www.psapublishing.org/oe/abstract.cfm?uri=oe-22-I-305.

* cited by examiner

OPTOELECTRONIC OSCILLATOR WITH TUNABLE FILTER

FIELD

The present disclosure relates to optoelectronics, including but not limited to optoelectronic circuits such as an optoelectronic oscillator.

BACKGROUND

Optoelectronic oscillators (OEOs) provide the combined lowest phase noise and widest bandwidth signal sources currently available in the microwave and millimeter frequency ranges. Commercial units are becoming available which are setting a new standard with respect to system phase noise and, as a result, system sensitivity.

The improved phase noise performance provided by OEOs allows improved RADAR detection. Previously, travelling wave tube amplifiers (TWTAs) had limited the RADAR integrated phase noise, known as coherence, to levels of approximately −50 dBc over integration bandwidths from 10 Hz to 1 MHz. The use of solid state amplifiers provided improvements in the coherence of the microwave power generation device to approximately −70 dBc, at which point the local oscillator phase noise became the limiting factor with respect to RADAR coherence. OEOs enable −90 dBc noise floors, which moves the system coherence limitation back to other components in the RADAR.

In order to obtain OEO oscillations, a commonly used component is an optical delay line. The OEO phase noise decreases as the length of this optical delay line is increased. For a given optical delay line length, an OEO will produce periodic oscillatory modes resulting in an output frequency comb. For use as an oscillator signal in a radio frequency system, a single mode, or frequency, is desirable. Mode selection can be made by a bandpass filter of suitable center frequency and bandwidth.

It is desirable to have a long optical delay line length to obtain low phase noise. However, as the delay line is increased, the frequency spacing between adjacent modes decreases. For example, for a RADAR oscillator signal of 10 GHz, the mode spacing for desired OEO phase noise performance could be 400 kHz. Producing a bandpass filter centered at 10 GHz with a bandwidth of less than 400 kHz bandwidth is not possible with current OEO topologies.

Some approaches have used multiple parallel optical delay lines of different lengths to increase the mode spacing to approximately 30 MHz. This allows the use of YIG filters, which can be tuned. However, YIG filters are bulky, expensive and have slow tuning characteristics. Multiple optical delay lines require additional photodetectors and optical modulator input ports. Additional problems with using multiple parallel optical delay lines of different lengths include: increased sensitivity to thermal drift and mechanical vibration; and an increase in size due to the additional bulk resulting from the multiple parallel optical delay lines.

Other attempted solutions have used glass whispering gallery mode resonators. These have the advantage of smaller size than optical fiber delay line based solutions. However the glass resonator technology is not readily manufacturable, resulting in higher costs and lower production volumes.

To realize a wide bandwidth low phase noise OEO there is a need for a filter that can operate at the RADAR oscillator frequency, which is able to filter tightly spaced OEO modes, and is capable of fast and fine frequency tuning.

BRIEF DESCRIPTION OF THE DRAWINGS

Embodiments of the present disclosure will now be described, by way of example only, with reference to the attached Figures.

DETAILED DESCRIPTION

Figure 1:
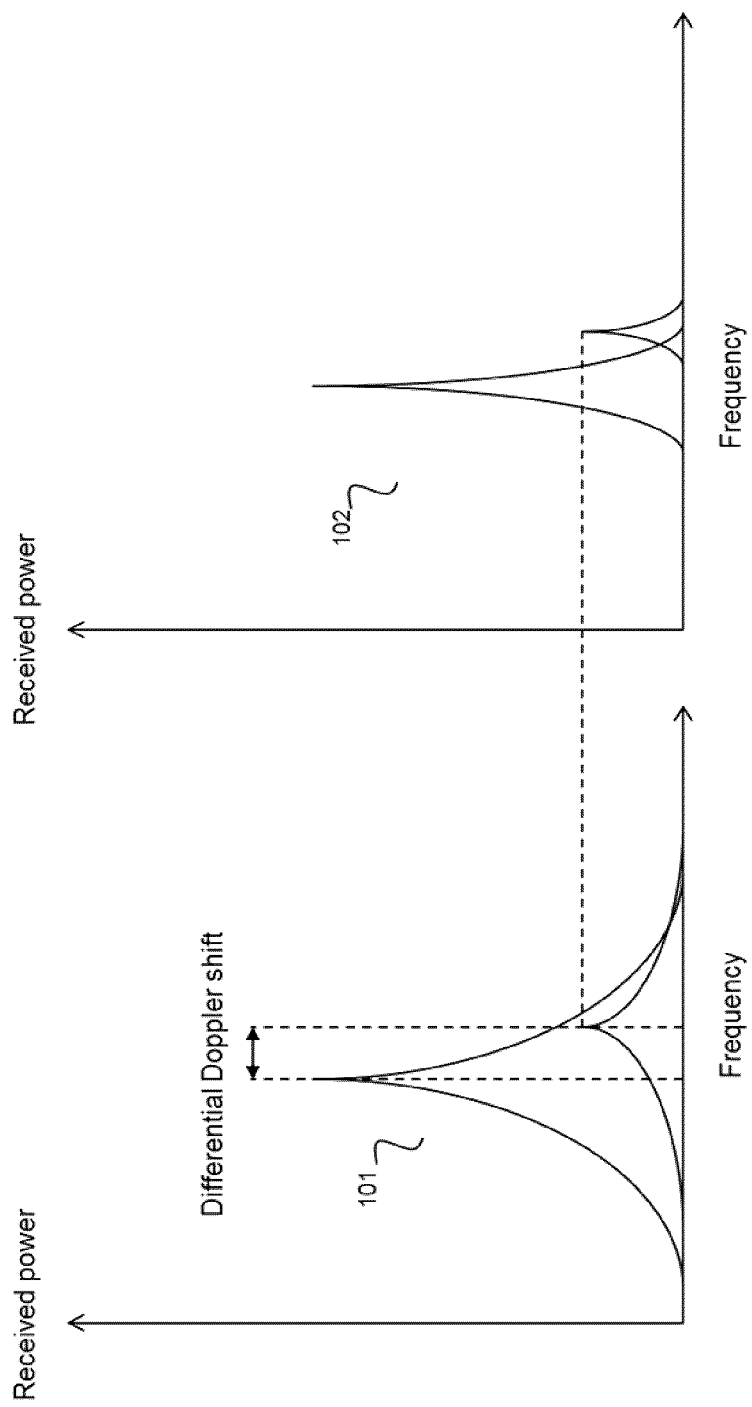
FIG. 1 illustrates the impact of signal source phase noise on RADAR target detection sensitivity.

An optoelectronic oscillator (OEO) is disclosed comprising an electronically tunable filter for transposing narrow pass band characteristics of a surface acoustic wave (SAW) filter to a microwave frequency to provide mode selection in the OEO. An OEO is disclosed comprising a set of optical domain components, a downconverter in communication with an output of the optical domain components, and a set of radio frequency (RF) domain components in communication with an output of the downconverter. The set of RF domain components comprises a tunable filter operating at a filter center frequency and having an output coupled to the set of optical domain components for communicating a mode selection result. The tunable filter including a tuner; and a sub-filter. The sub-filter operating at a fixed center frequency to provide mode selection and adjacent mode suppression with respect to the tunable filter center frequency. The sub-filter center frequency is lower than the tunable filter center frequency, and a ratio of the tunable filter center frequency to a bandwidth of the sub-filter is at least 1000:1.

In an example implementation, the OEO can include image rejection mixers; in such an implementation, the transposition results in a single pass band characteristic. The OEO can include a control loop for stabilizing the OEO output against thermally induced variation in a laser through means of a phase lock to a stable crystal reference. In an implementation, the reference for the phase lock of the optoelectronic loop is a direct digital synthesizer (DDS) such that the loop can be accurately centered in frequency and tuned between loop modes, resulting in a true continuous tuning bandwidth. A continuously tunable optoelectronic oscillator is disclosed. An optoelectronic oscillator comprises a wideband electronically DDS controlled tunable filter with high finesse that enables oscillator mode selection and continuous frequency tuning.

In a first aspect, the present disclosure provides an optoelectronic oscillator (OEO) comprising: a set of optical domain components; a downconverter in communication with an output of the optical domain components; and a set of radio frequency (RF) domain components in communication with an output of the downconverter, the set of RF domain components comprising: a tunable filter operating at a filter center frequency and having an output coupled to the set of optical domain components for communicating a mode selection result, the tunable filter including: a tuner; and a fixed frequency sub-filter operating at a sub-filter center frequency to provide mode selection and adjacent mode suppression with respect to the tunable filter center frequency, the sub-filter center frequency being lower than the tunable filter center frequency, and a ratio of the tunable filter center frequency to a bandwidth of the sub-filter being at least 1000:1.

In various embodiments, the OEO the tunable filter output is coupled to the set of optical domain components for communicating the mode selection result via a modulator.

In some embodiments, the sub-filter comprises a resonator or filter having an adjacent mode suppression characteristic providing about 50 dB to about 60 dB of adjacent mode suppression.

In some embodiments, the sub-filter comprises a surface acoustic wave (SAW) filter.

In some embodiments, the sub-filter is selected from the group consisting of: a dielectric resonator filter, an air filled cavity filter, and a whispering gallery mode resonator filter.

In some embodiments, the tunable filter further comprises a first tunable filter module and a second tunable filter module. In various embodiments, the first tunable filter module and second tunable filter module are configured in a cascade arrangement.

In some embodiments, the first tunable filter module and the second tunable filter module are configured in a parallel arrangement. In various embodiments, the first tunable filter module and second tunable filter module have different passband bandwidths.

In some embodiments, the first tunable filter module and second tunable filter module have overlapping passbands. In various embodiments, the first tunable filter module and second tunable filter module have non-overlapping passbands.

In some embodiments: the first tunable filter module comprises the tuner and the sub-filter; and the second tunable filter module comprises a second tuner and a second sub-filter.

In some embodiments, the RF domain components further comprise a feedback corrector, the feedback corrector including: a phase modulator; a first input coupled to the tuner, a second input coupled to the tunable filter, and an output coupled to the optical domain components. In various embodiments, the phase modulator couples the tunable filter to the optical domain components. In various embodiments, the tunable filter comprises a down-conversion mixer, an up-conversion mixer, where the sub-filter is coupled to an output of the down-conversion mixer and to a first input of the up-conversion mixer, and a compensating sub-filter coupled to a second input of the up-conversion mixer for providing a delay to a reference signal to the up-conversion mixer to compensate for a delay time provided by the sub-filter disposed between the down-conversion mixer and the up-conversion mixer. In various embodiments the OEO further comprises a cancellation module comprising a first input coupled to the tunable filter, a second input coupled to the tuner and an output coupled to the tunable filter.

In some embodiments, the OEO further comprises a cancellation module comprising a first input coupled to the tunable filter, a second input coupled to the tuner and an output coupled to the phase modulator.

In some embodiments, the RF domain components further comprise a feedback loop comprising the tunable filter and a bias feedback loop comprising a bias corrector and a supply modulator.

In some embodiments, the tuner is operable over at least an octave of frequency. In some embodiments, the optical domain components comprise an optical delay. In various embodiments, the optical delay is a single optical fibre.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

An OEO can be used to provide one or more of: a vibration stable source; phase noise independent of operating frequency; lowest phase noise microwave source currently on the market. OEOs are applicable in technology applications such as one or more of the following: airborne RADAR application, including avionics and space; weather RADAR requiring low close in phase noise; high clutter environment RADAR; systems required to track slow moving low RADAR cross-section targets; systems required to track multiple targets having low differential velocity; high vibration environments; best in class microwave test and measurement equipment; source requirements from L band to W band.

An X band OEO with close-in phase noise of −163 dBc/Hz at 10 kHz offset frequency from a 10 GHz carrier has been reported. Such performance will improve the target resolution of pulse Doppler RADAR which is in part limited by the close-in phase noise of the frequency sources. This effect is illustrated in FIG. 1 which shows two targets having different RADAR returns but similar velocities. Graph 101 shows how the phase noise of the larger target return masks the smaller return echo making the target undetectable. Graph 102 illustrates how improvement in the RADAR source phase noise enables the smaller target to be detected. RADAR with lower phase noise is capable of resolving targets with similar Doppler shifts but different RADAR cross-sections.

An OEO also enables high performance phase noise measurement systems to be developed. Specifically, the OEO would improve the accuracy of pulse-to-pulse phase noise coherency measurements. An OEO has excellent immunity to EMC because of the high isolation between electrical and photonic signals.

Frequency sources using an OEO have very low g-sensitivity and find application to airborne environments. There is potential application to vibration stabilization of microwave synthesizers. A key factor of the OEO is that its phase noise performance does not degrade with increasing frequency.

Figure 2:
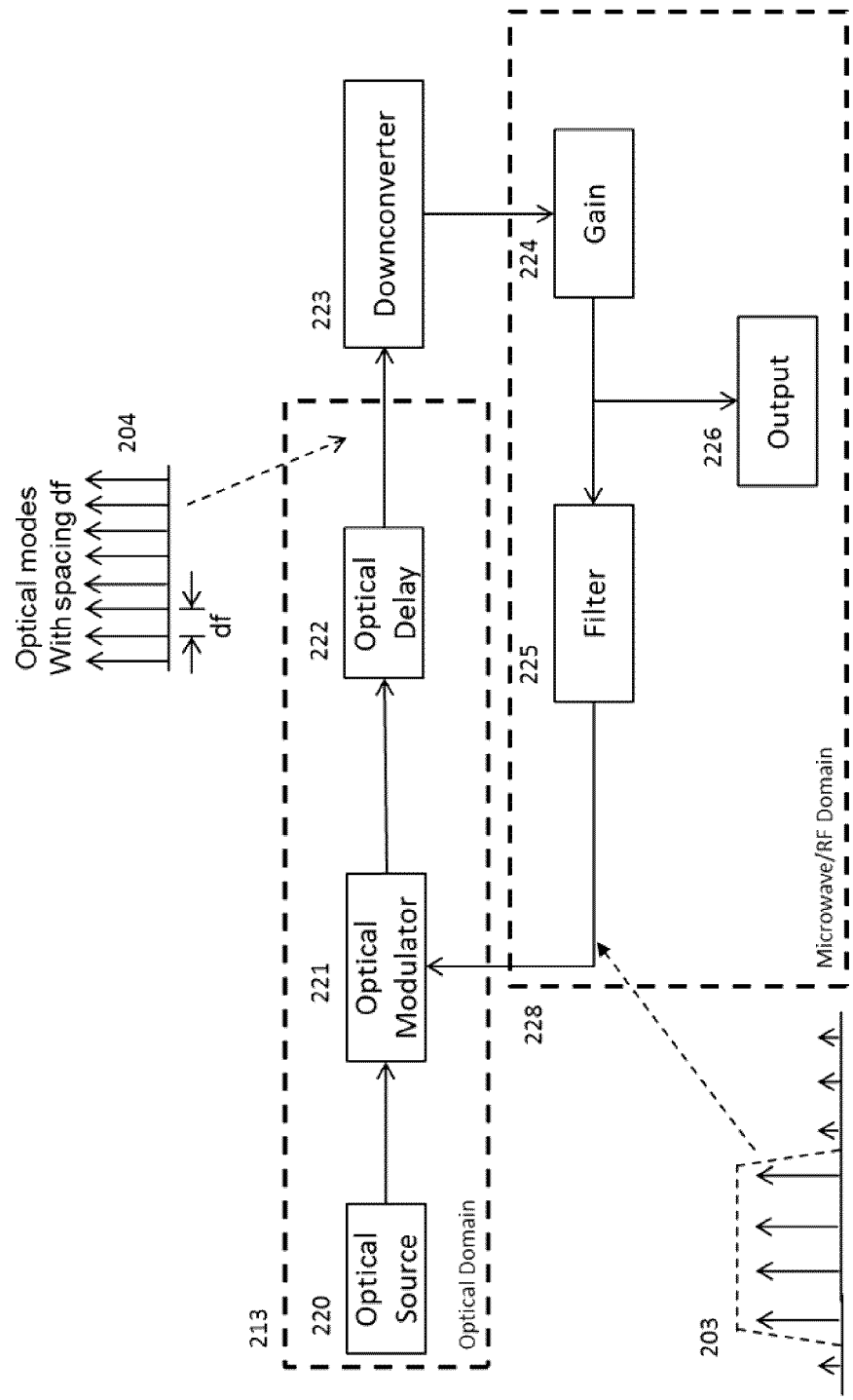
FIG. 2 illustrates a block diagram of a known optoelectronic oscillator.

FIG. 2 illustrates a block diagram of a known optoelectronic oscillator. The components of FIG. 2 broadly include optical components 213 and microwave/RF domain components 228. In the oscillator of FIG. 2, an optical source 220, is used to generate an optical signal which is intensity modulated by a RF signal using an electro-optic modulator 221. The RF signal modulates the laser intensity resulting in amplitude modulation sidebands appearing at an offset frequency from the optical signal equal to that of the RF frequency applied to the electrical ports of the modulator. The modulated optical signal is passed through an optical delay 222, which can comprise a spool of single mode fiber or an optical resonator.

A downconverter 223 produces an electrical signal proportional to the optical signal intensity resulting in recovery of an RF signal that includes modulation. The RF signal is amplified at an RF gain element 224, filtered at filter 225, and fed back into the electrical port of the modulator 221. This completes an OEO feedback loop comprising the optical modulator 221, the optical delay 222, the downconverter 223, the gain element 224 and the filter 225. The gain of the gain element 224 is selected to compensate for the electro optical loss around the loop. Oscillatory signals are established around the OEO feedback loop for frequencies for which the OEO feedback loop loss has been compensated by the gain 224, and for which the electro-optical signal experiences 2 nπ radians of phase shift, n being an integer 1, 2, 3 . . . The filter 225 enables the OEO feedback loop to reinforce the desired range of modes.

In the example of FIG. 2, the following relationships and parameters are relevant:

Modes are spaced by:

$$df = c/(N \cdot L) \qquad \text{Equation 1}$$

where N=refractive index of fiber ~1.45;
c=velocity of light in free space=300×10$^6$ m/s;
L=fiber length in meters; and
df=206.9 kHz for 1 km fiber.

The OEO fiber loop quality factor is:

$$Q = \pi \cdot td \cdot fo \qquad \text{Equation 2}$$

where td=fiber delay=L/c; and
fo=RF modulation frequency

In the case of 1 km of fiber, Q=1×10$^5$ which is orders of magnitude higher than a microwave or RF resonator.

A drawback of the approach illustrated in FIG. 2 is, as the optical delay is increased to further improve phase noise, the mode spacing, df, decreases. The result is a very narrow comb of tightly spaced spectral lines, or frequencies, 203, 204. A key technical challenge of an OEO implementation is to isolate a single mode frequency and suppress all other modes. This challenge is made more difficult as the spacing between spectral lines df is reduced.

In an example scenario, a filter can be used to select a desired center frequency. In a specific example having a desired center frequency of 10 GHz, for a required phase noise the mode spacing is approximately df=200 kHz, resulting in a single mode selection bandwidth, df, of approximately 200 kHz. This results in a filter Q-factor of approximately 50,000 which is not possible using known conventional techniques.

Embodiments of the present disclosure provide a continuously tunable OEO. Continuous tuning refers to tuning of a center frequency in 1 Hz increments. Providing continuous tuning according to embodiments of the present disclosure is desirable to address wideband frequency agile system requirements and reduced manufacturing cost.

Other embodiments of the present disclosure provide a phase locked OEO. An OEO according to an embodiment of the present disclosure can be incorporated in low phase noise measurement systems.

Figure 3:
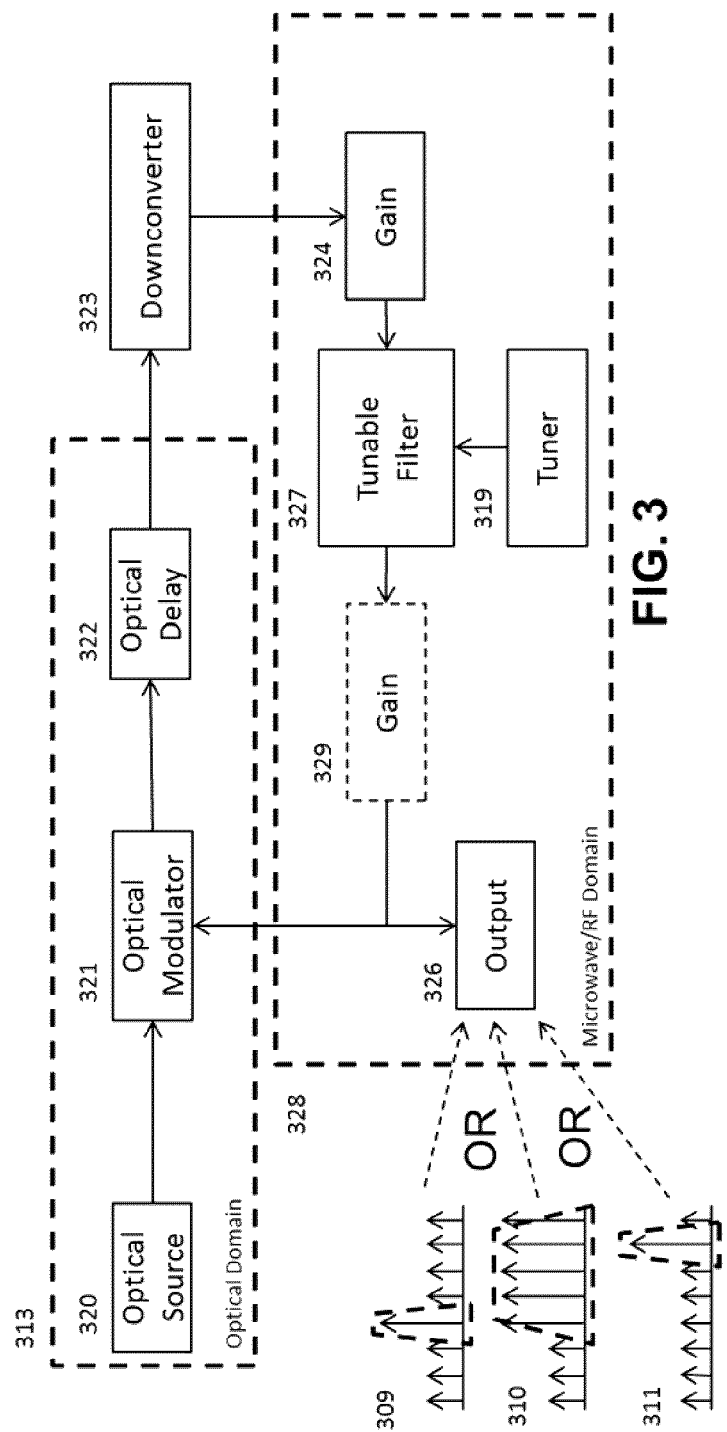
FIG. 3 illustrates a block diagram of an optoelectronic oscillator according to an embodiment of the present disclosure.

FIG. 3 illustrates a block diagram of an optoelectronic oscillator according to an embodiment of the present disclosure. Unlike YIG based solutions, the topology of FIG. 3 enables tightly spaced modes to be isolated. Tightly spaced modes in this context are in the range of up to 400 kHz, which is much tighter spacing than the performance obtained by known approaches. For example, YIG based solutions are limited to modes spaced in the range 10 MHz to 40 MHz. Isolation of a mode is obtained by suppressing the amplitude, or power level, of adjacent modes.

In the example embodiment of FIG. 3, optical domain components 313 include an optical source 320, an optical modulator 321 and an optical delay 322. In this embodiment, an output of the optical domain components is in communication with a downconverter 323, which is configured to convert optical energy into lower frequency energy, such as radio frequency energy. In an example embodiment, the radio frequency energy is in the microwave domain.

In the example embodiment of FIG. 3, a set of RF domain components 328 is in communication with the output of the downconverter 323. The set of RF domain components 328 includes, in various embodiments, one or more of: individual components such as resistors, diodes and transistors;

modules such as amplifiers, phase locked loops and filters; structures such as waveguide, striplines and microstrip; and systems comprising multiple individual components, sub-modules and modules. The output of the RF domain components 328 is in communication with the optical domain components 313. The optical domain components 313, the downconverter 323 and the RF domain components 328 are configured such that an oscillation is sustained in at least one mode, or frequency.

In the example embodiment of FIG. 3, the set of RF domain components 328 comprises a tunable filter 327 operating at a filter center frequency and having an output coupled to the set of optical domain components 313 for communicating a mode selection result.

In the example embodiment of FIG. 3, the tunable filter comprises a sub-filter; in such an example embodiment the output of the downconverter 323 is received by the RF domain components 328 at gain 324. In an alternate embodiment, the gain is instead located after the tunable filter 327 as indicated by gain 329. In another embodiment, gain 324 is provided on the input to the tunable mode selector 327, in addition to the gain 329 at the output thereof. In an example embodiment the tunable filter 327 includes a tuner; and a sub-filter. The sub-filter operates at a fixed center frequency to provide mode selection and adjacent mode suppression with respect to the tunable filter center frequency. The sub-filter center frequency is lower than the tunable filter center frequency, and a ratio of the tunable filter center frequency to a bandwidth of the sub-filter is at least 1000:1.

The tunable filter 327 in an example embodiment includes an output coupled to the set of optical domain components for communicating a mode selection result. The mode selection result may include a single mode or multiple adjacent modes depending upon the mode spacing and the bandwidth of the first passband.

In an example embodiment, the sub-filter center frequency is 1 GHz; in other embodiments, other center frequencies in the radio frequency domain are provided. In an example embodiment, the bandwidth of the sub-filter passband corresponds to the spacing of tightly spaced modes. In another example embodiment, the bandwidth of the sub-filter passband is substantially equal to or less than the spacing between two adjacent modes. In an example embodiment, the sub-filter center frequency is lower than the tunable filter center frequency.

In the example embodiment of FIG. 3, the tunable filter 327 comprises a filter having an output coupled to the set of optical domain components 313 for communicating the mode selection result to an optical modulator 321. In an example embodiment, the tunable filter includes a sub-filter which comprises a resonator or filter having an adjacent mode suppression characteristic providing about 50 dB to about 60 dB of adjacent mode suppression.

In an example embodiment, the tunable filter center frequency is about 10 GHz; in another example embodiment, the tunable filter center frequency is at other frequencies, for example in the radio frequency range. In an example embodiment, the bandwidth of the tunable filter passband corresponds to optoelectronic oscillator mode spacings, and the OEO provides a tunable filter passband that corresponds to the spacing of tightly spaced modes. Examples of the spacing of tightly spaced modes in example embodiments include about 30 kHz, 100 kHz, 200 kHz and 400 kHz.

In an example embodiment, the optical delay 322 is provided by, and comprises, a single optical delay line having a length, where the spacing of tightly spaced modes is inversely proportional to the length of the optical delay 322, as provided by Equation 1. In an embodiment, the optical delay line length is in the range of about 1 km to about 15 km. In another example embodiment, the present disclosure is operable for optical delay line lengths outside the range 1 km to 15 km.

In an example embodiment, the sub-filter comprises a SAW filter. In an example embodiment, the sub-filter is selected from the group consisting of: a dielectric resonator filter, an air filled cavity filter, and a whispering gallery mode resonator filter. The features described in relation to FIG. 3 are not limited to the embodiment of FIG. 3 and these features can be applied to other embodiments described in the present disclosure, which will now be described.

Figure 4:
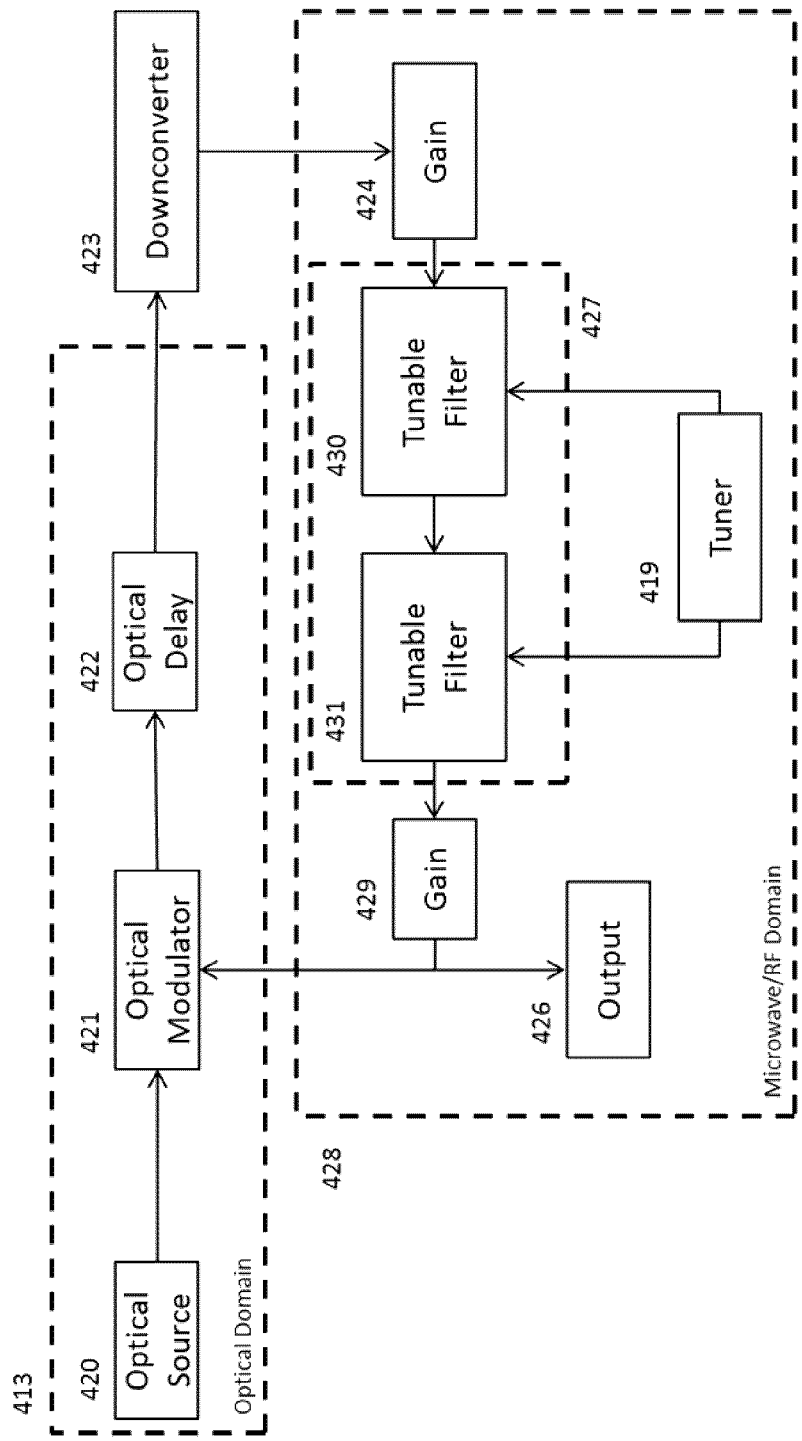
FIG. 4 illustrates a block diagram of an optoelectronic oscillator with dual tunable mode selection according to an embodiment of the present disclosure.

FIG. 4 shows an embodiment that incorporates a tunable filter 427 comprising a first tunable filter module 430 cascaded with a second tunable filter module 431. In this embodiment the oscillator feedback loop gain 424, 429 has been distributed on either side of the tunable filter 427. In some embodiments, feedback loop gain can be included between the output of tunable filter module 430 and the input of tunable filter module 431. An example embodiment as shown in FIG. 4 comprises a set of optical domain components 413, a downconverter 423 in communication with an output of the optical domain components 413, and a tunable filter 427 operating at a passband in the microwave domain and having a filter center frequency. The tunable filter 427 has an output coupled to the set of optical domain components via gain 429. The tunable filter 427 comprises a first tunable filter module 430 and a second tunable filter module 431. In an example embodiment the two tunable filter modules 430, 431 are connected in a parallel arrangement. In some embodiments the two tunable filter modules 430, 431 are connected in a parallel arrangement and the filter modules 430, 431 have non-overlapping passbands. Multi-mode selection is one application for a parallel arrangement.

In an example embodiment, the first and second tunable filter modules 430, 431 are identical in terms of center frequency and bandwidth; in another example embodiment, the first and second tunable filters 430, 431 have different center frequencies, or bandwidths, or both. For example, an embodiment has first and second tunable filter modules 430, 431 with different center frequencies but similar, or the same, bandwidths. In an example embodiment, first and second tunable filter modules have bandwidths that are in the range of several MHz and have center frequencies in the range of 10 GHz. In an example embodiment, the tuner 419 not only provides continuous and fast tuning of the center frequencies of tunable filter modules 430 and 431 but also independent adjustment of the tunable filter modules' center frequencies to allow overlap of the filter modules' transfer characteristics to enable the bandwidth of the composite tunable filter 427 to be electronically controlled in addition to its center frequency. In some example embodiments, the tuner 419 is implemented as a single tuner with dual outputs, each output capable of independently tuning each tunable filter module 430, 431. In other example embodiments, the tuner 419 comprises a tuner for each tunable filter module 430, 431, enabling independent adjustment of the tunable filter modules' center frequencies to allow overlap of the filter modules' transfer characteristics to enable the bandwidth of the composite tunable filter 427 to be electronically controlled in addition to its center frequency.

In an embodiment, the first tunable filter module 430 includes a first sub-filter operating at a first fixed frequency in the RF domain and having a first passband and an associated first sub-filter center frequency, the sub-filter providing mode selection and adjacent mode suppression. In an embodiment the first sub-filter center frequency is lower than the tunable filter 427 center frequency. In an embodiment the sub-filter bandwidth is substantially equal to or less than a spacing between two adjacent modes. In other example embodiments the bandwidth of the sub-filter is substantially greater than the spacing between two adjacent modes.

In an embodiment, the second tunable filter module 431 includes a second sub-filter operating at a second fixed frequency in the RF domain and having a second passband and an associated second sub-filter center frequency, the second sub-filter providing mode selection and adjacent mode suppression. In an embodiment the second sub-filter center frequency is lower than the tunable filter 427 center frequency. In an embodiment the second sub-filter bandwidth is substantially equal to or less than a spacing between two adjacent modes. In other example embodiments the bandwidth of the second sub-filter is substantially greater than the spacing between two adjacent modes.

In an embodiment the first passband of the first tunable filter module 431 is partially overlapping with the second passband of the second tunable filter module 427 forming an overlapping passband, such that a filter bandwidth of the tunable filter 427 corresponds to the bandwidth of the overlapping passband. In other example embodiments the bandwidth of the first passband associated with the first sub-filter is substantially the same as the bandwidth of the second passband associated with the second sub-filter. In some example embodiments the bandwidth of the first passband associated with the first sub-filter is different from the bandwidth of the second passband associated with the second sub-filter.

In an embodiment: the bandwidth of the first passband associated with the first tunable filter module 430 is substantially the same as the bandwidth of the second passband associated with the second tunable filter module 431; and the center frequency of the first tunable filter module 430 is offset from the center frequency of the second tunable filter module 431. The center frequency offset is such that the first passband of the first tunable filter module 430 overlaps with the second passband of the second tunable filter module 431 resulting in an overlapping passband which corresponds to the passband of the tunable filter 427. In this embodiment the bandwidth of the tunable filter 427 passband is less than the bandwidth of the first tunable filter module 430 passband. In some embodiments the bandwidth of the first tunable filter module 430 passband is greater than the spacing between modes, and the bandwidth of the tunable filter 427 is equal to or less than the spacing between modes. The bandwidth of the first tunable filter module 430 passband corresponds to the bandwidth of a sub-filter passband. In some embodiments the bandwidth of the first tunable filter module 430 corresponds to approximately 40 MHz and the bandwidth of the overlapping passband corresponds to approximately 200 kHz. In some embodiments the bandwidth of the first passband associated with the first tunable filter module 430 is different from the bandwidth of the second passband associated with the second tunable filter module 431.

A feature of embodiments using overlapping passbands is that a cascade of two wideband filters results in lower effective delay which reduces de-correlation of the filter reference signal source; this results in lower degradation of the OEO loop phase noise than would be the case with a single conventional filter having a 200 kHz bandwidth. In some embodiments, a frequency offset is applied by tuner 419 to the tuning input of both of the electronically tunable filters in order to obtain different center frequencies for the first and second tunable filter modules 430, 431.

Figure 5:
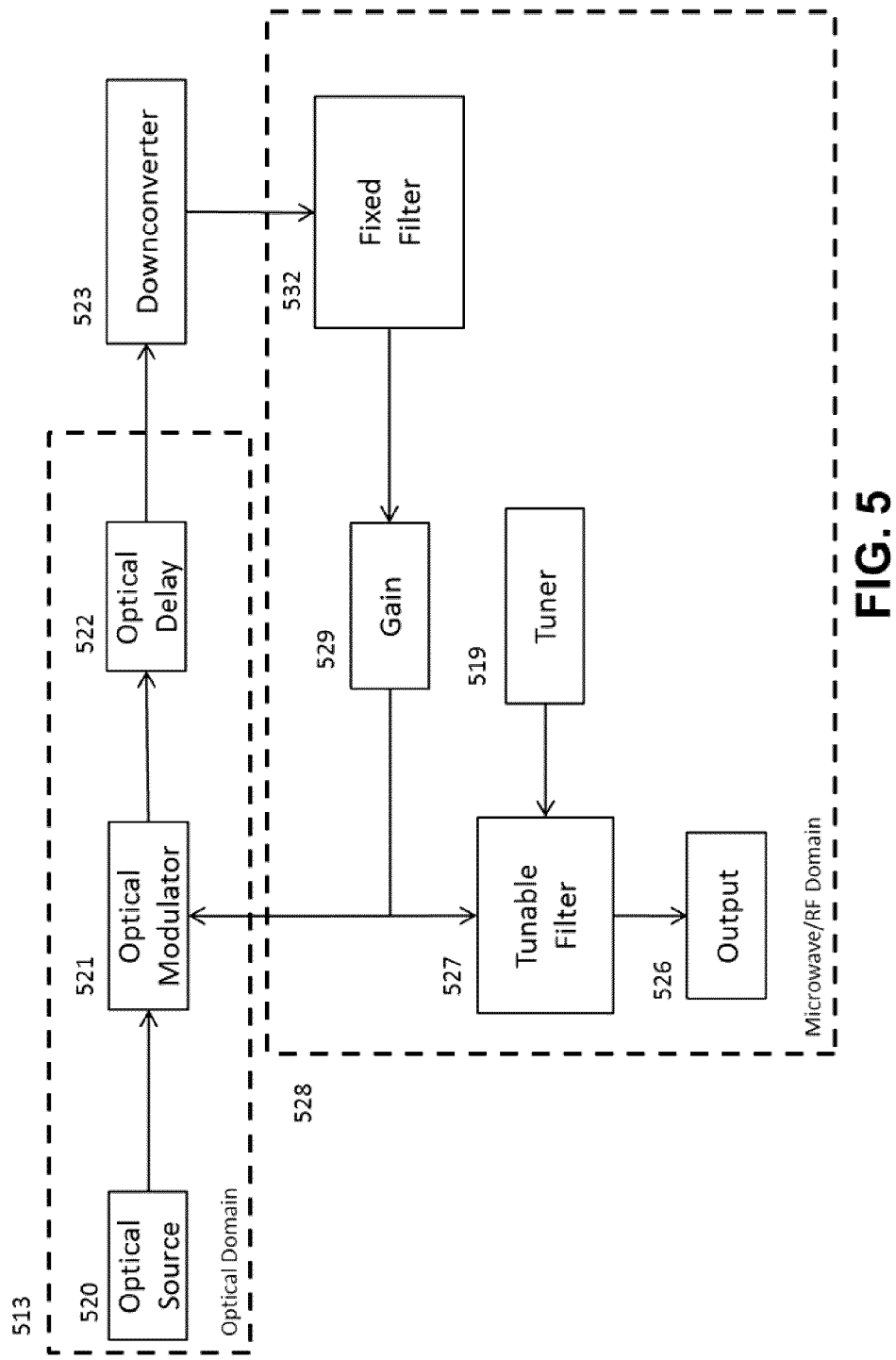
FIG. 5 illustrates a block diagram of an optoelectronic oscillator with tunable mode selection occurring outside the feedback loop according to an embodiment of the present disclosure.

FIG. 5 shows an alternative embodiment of the present disclosure which includes a tunable filter 527 that is placed outside the OEO feedback loop and isolates a desired mode from the comb of modes present in the OEO feedback loop. Referring back to the embodiment of FIG. 3, the tunable filter 327 is within the OEO feedback loop comprising an optical modulator 321, an optical delay 322, an optical downconverter 323, a gain element 324 and a tunable filter 327. In contrast, the alternative embodiment as shown in FIG. 5 comprises a tunable filter 527 that is coupled to an OEO feedback loop which comprises an optical modulator 521, an optical delay 522, a downconverter 523, a fixed filter 532 and a gain element 529. In some embodiments the fixed filter 532 has a bandwidth wider than the spacing between modes such that the OEO feedback loop contains several modes. The tunable filter 527 is then used to select one of the several modes present in the OEO feedback loop.

Figure 6:
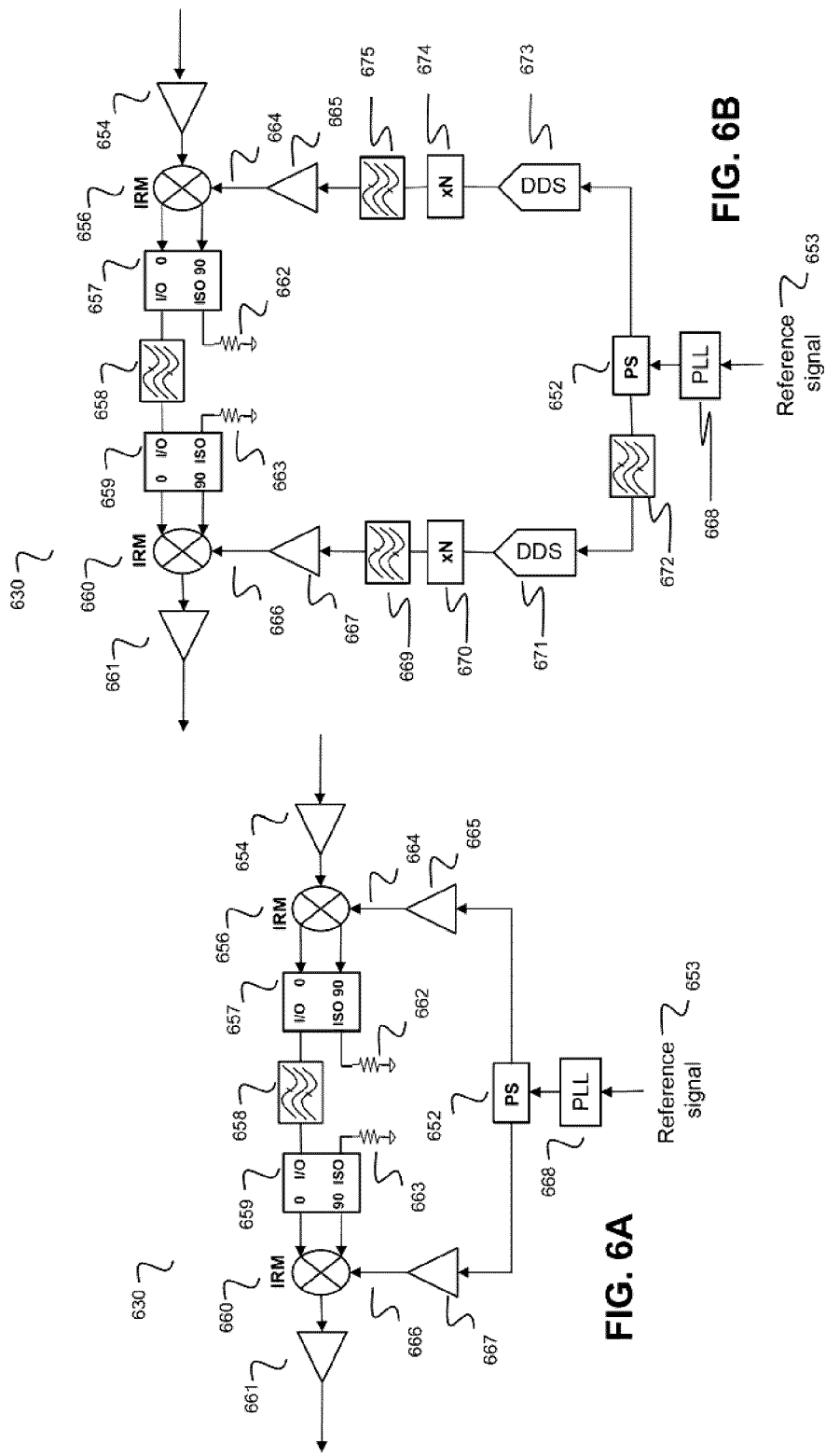
FIG. 6A illustrates the operation of the tunable mode selection according to an embodiment of the present disclosure.
FIG. 6B illustrates the operation of the tunable mode selection for a high delay sub-filter according to an embodiment of the present disclosure.

FIG. 6A shows an example embodiment of a single electronically tunable filter module 630, which may be used for the tunable filter 327, 427, 527 in FIGS. 3, 4, 5 respectively. In the example embodiment of FIG. 6A a reference signal is applied to a phase locked loop (PLL) 668. The PLL 668 can be locked to a frequency stable reference oscillator to enable correction of thermal and vibration induced frequency fluctuations resulting from the oscillator operating environment. The output of the PLL 668 is split by power splitter (PS) 652 and applied to a first mixer 656 which in an example embodiment is an image reject mixer (IRM). In some embodiments the tunable filter module 630 center frequency is set by the PLL. A second input to the mixer 656 is the OEO feedback loop signal that is communicated from a downconverter and in the embodiment of FIG. 6A has been amplified by gain 654. In an example embodiment this second input contains several OEO modes.

The mixer 656 downconverts the OEO modes to a sub-filter 658 passband in the RF domain and having a sub-filter center frequency which may be at a lower frequency than the tunable filter module 630 center frequency. The frequency modes in the sub-filter 658 pass band are filtered by sub-filter 658 which, in an example embodiment, has a bandwidth that is significantly higher than the separation between OEO modes. An advantage of using a higher bandwidth filter for sub-filter 658 is reduced delay through the sub-filter 658. In some implementations, using a sub-filter 658 having a passband bandwidth which is significantly higher than the separation between OEO modes results in several modes being present at the output of the sub-filter 658. This can be addressed by cascading tunable filter module 630 with a second tunable filter module having an offset center frequency such that the passband of each tunable filter overlaps. This results in a cascaded tunable filter response having a passband bandwidth that is equal to or less than the spacing between modes, whilst having a low delay.

In another example embodiment, the sub-filter 658 has a bandwidth that is comparable to the separation between OEO modes; this example embodiment has the drawback of increased delay between mixer 656 and 660.

An advantage of the embodiment of FIG. 6A is that higher performance filters are available at lower frequencies, for example some embodiments use SAW filters that are limited in center frequency to approximately 1 GHz with current technology. The output of sub-filter 658 is upconverted by a second mixer 660 to a higher frequency band. In an example embodiment, the second mixer 660 is an image reject mixer.

The low delay provided by a wideband sub-filter 658 results in improved system phase noise due to the improved correlation, or coherence, between the mixed signals present at mixers 656 and 660. De-correlation of the PLL signal as a result of the filter delay results in increased transfer of the tunable filter PLL noise to the optoelectronic oscillator system phase noise.

In the tunable filter embodiment of FIG. 6A wideband frequency tuning of the tunable filter can be achieved through the reference PLL 668. In some embodiments the time delay of sub-filter 658 is sufficiently short so as not to introduce phase noise cancellation issues. In other embodiments the time delay of sub-filter 658 is such that phase noise becomes problematic. FIG. 6B shows an embodiment employing the use of delay compensation to provide improved phase noise performance, in which case elements DDS 671, frequency multiplier 670, filter 669, filter 675, frequency multiplier 674, DDS 673 and compensating sub-filter 672 are added to the embodiment of FIG. 6A. The operation of the embodiment shown in FIG. 6A is similar to that of FIG. 6B, and a particular oscillator embodiment may incorporate the features of either FIG. 6A or FIG. 6B, depending upon the particular application. The additional features of FIG. 6B, in relation to FIG. 6A are described below.

The output of the PLL 668 is split by power splitter (PS) 652 and applied to a direct digital synthesizer 673 which acts to provide a variable frequency signal to the multiplier element 674. The output of multiplier 674 is filtered by band pass filter 675 and then amplified by amplifier 665 before being applied to first mixer 656 which in an example embodiment is an image reject mixer (IRM). In some embodiments the tunable filter module 630 center frequency is set by the PLL in other example embodiments it is set by the two DDS 673 and 671.

In some embodiments, delay compensation is achieved by delaying the reference signal to the up-conversion mixer 660 by an amount equal to the delay of the sub-filter 658. One embodiment employing delay compensation is shown in FIG. 6B. The delay compensation is achieved by compensating sub-filter 672. In an embodiment, compensating sub-filter 672 provides a delay that is approximate, or identical to, the delay provided by sub-filter 658. The narrow frequency bandwidth requirement of filter 658 and 672 limits the frequency adjustment of the tunable filter by the reference path PLL 668. To overcome this limitation, direct digital synthesis components 671 and 673 are used to provide tunability whilst maintaining the time delay required to remove the reference signal phase noise at the second image rejection mixer 660. The frequency adjustable output of the DDS 671 is scaled to the required input frequency to mixer 660 by frequency multiplier 670. Multiplier 670 and 674 are set at the same value so that the signal used in the up and down conversion process in up-conversion mixer 660 and down-conversion mixer 656 have identical frequency, this is necessary for the reference phase noise to be removed by the dual conversion process. Multiplier elements 670 and 674 and DDS elements 671 and 673 are used as they maintain the reference signal phase which allows cancellation of the reference signal through the up and down conversion process. In an embodiment, replacement of the DDS and multiplier combination with a PLL would result in a decrease in the bandwidth over which the reference signals of the up and down conversion processes are correlated and as such limit the bandwidth over which the reference phase noise is cancelled from the signal processed by the filter.

Figure 7:
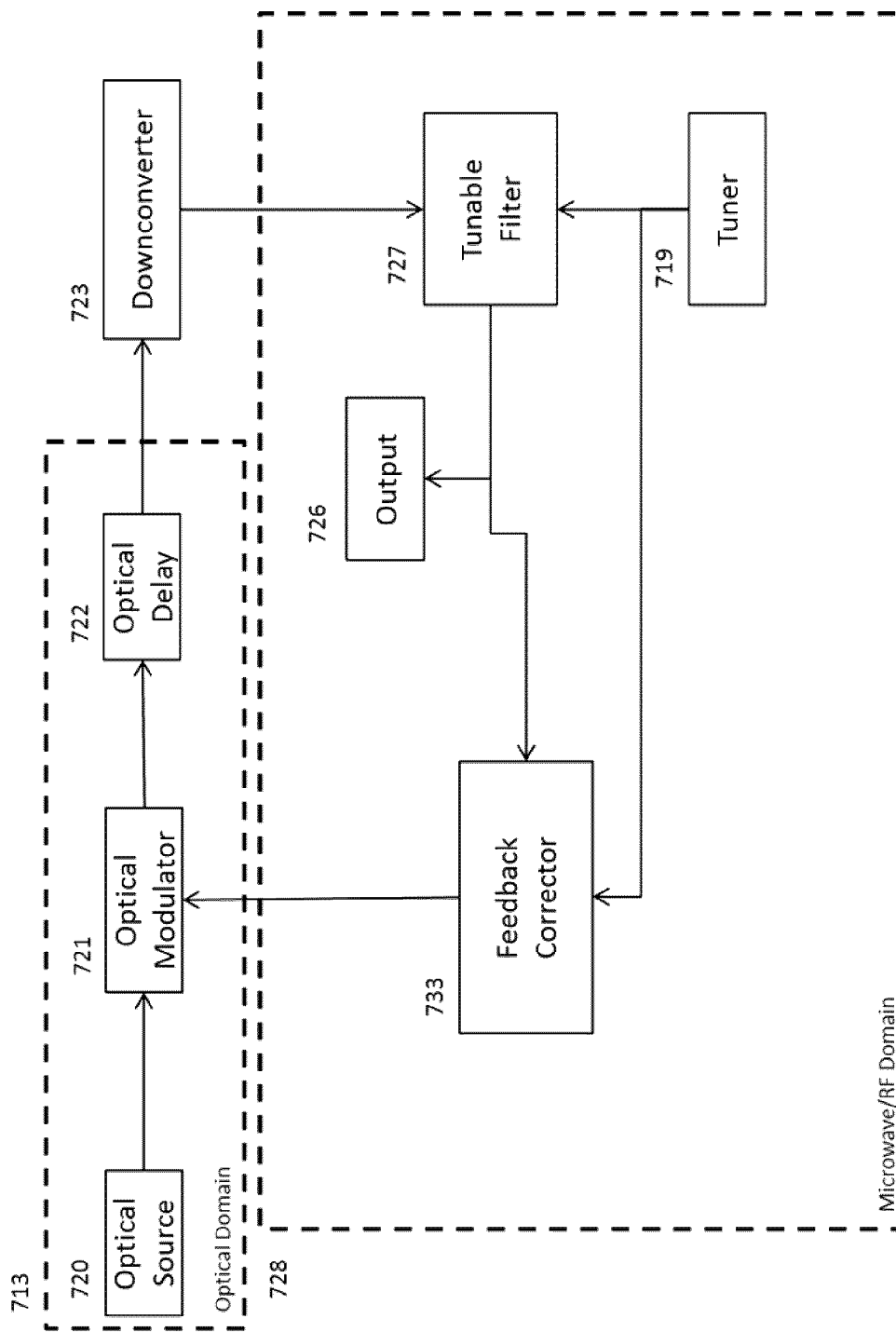
FIG. 7 illustrates a block diagram of an optoelectronic oscillator with tunable mode selection and feedback phase correction.

FIG. 7 illustrates a block diagram of an optoelectronic oscillator according to an embodiment of the present disclosure incorporating a feedback corrector 733 as part of the OEO feedback loop. In some embodiments the feedback corrector 733 includes: a phase modulator; a first input coupled to the tuner 719, a second input coupled to the tunable filter 727, and an output coupled to the optical domain components 713. The feedback corrector 733 uses the output of the tuner 719 as a reference in order to phase modulate the output of the tunable filter 727 such that the OEO phase noise is reduced. The feedback corrector 733 is configured to minimise the phase noise present at the output of the tunable filter 727 as will be discussed below. In an example embodiment, the tunable filter 727 comprises two electronically tunable filter modules with offset center frequencies such that the overall bandwidth of the tunable filter 727 corresponds to tightly spaced modes, these modes being spaced by approximately 200 kHz. In an example embodiment the tunable filter 727 comprises at least one sub-filter.

FIG. 7 shows an example embodiment of an optoelectronic oscillator including a tunable filter 727. In some embodiments, the tunable filter 727 is implemented in accordance with the tunable filter of either FIG. 6A or 6B. These embodiments have the advantage of high performance passband characteristics over a very wide center frequency tuning range. The high performance passband characteristics are attributed to the sub-filter 658. The very wide center frequency tuning range is attributed to the components associated with mixers 656, 660. An example filter center frequency tuning range achieved is 4 GHz, with a passband of approximately 200 kHz.

Figure 8:
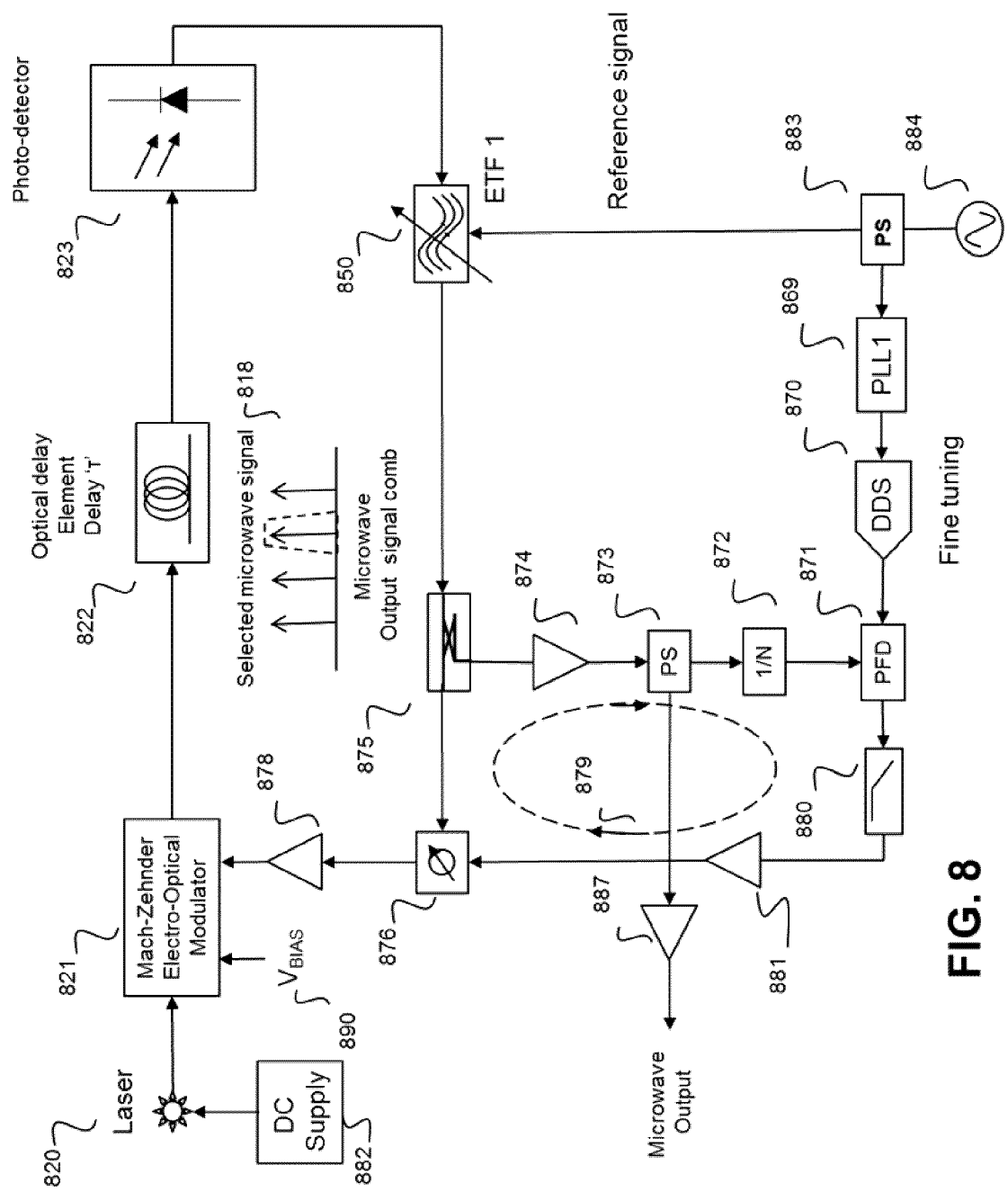
FIG. 8 illustrates a block diagram of an optoelectronic oscillator providing increased detail of feedback phase correction.

FIG. 8 illustrates an example embodiment according to the embodiment of FIG. 7 using a Mach-Zehnder optical modulator 821. The optical delay element 822 is a single length of optical fibre and a photo-detector 823 provides a downconversion from the optical domain to the RF domain. Feedback correction is implemented in this embodiment by phase locked loop components indicated by loop 879 and the OEO output is coupled to the feedback correction via signal splitter PS 873 and amplifier 887. The loop 879 components include phase modulator 876, feedback correction loop amplifier 881, phase frequency detector 871, and low pass filter 880. The phase modulator 876 couples the tunable filter 850 to the optical domain components 820, 821, 822 by coupler 875 and amplifier 878. The tunable filter 850 reference signal is derived from the same reference source 884 used as a reference for the feedback correction. In some embodiments the reference source 884 is a 100 MHz oven controlled crystal oscillator. In the embodiment of FIG. 8, OEO loop gain is provided by amplifier 878.

Figure 9:
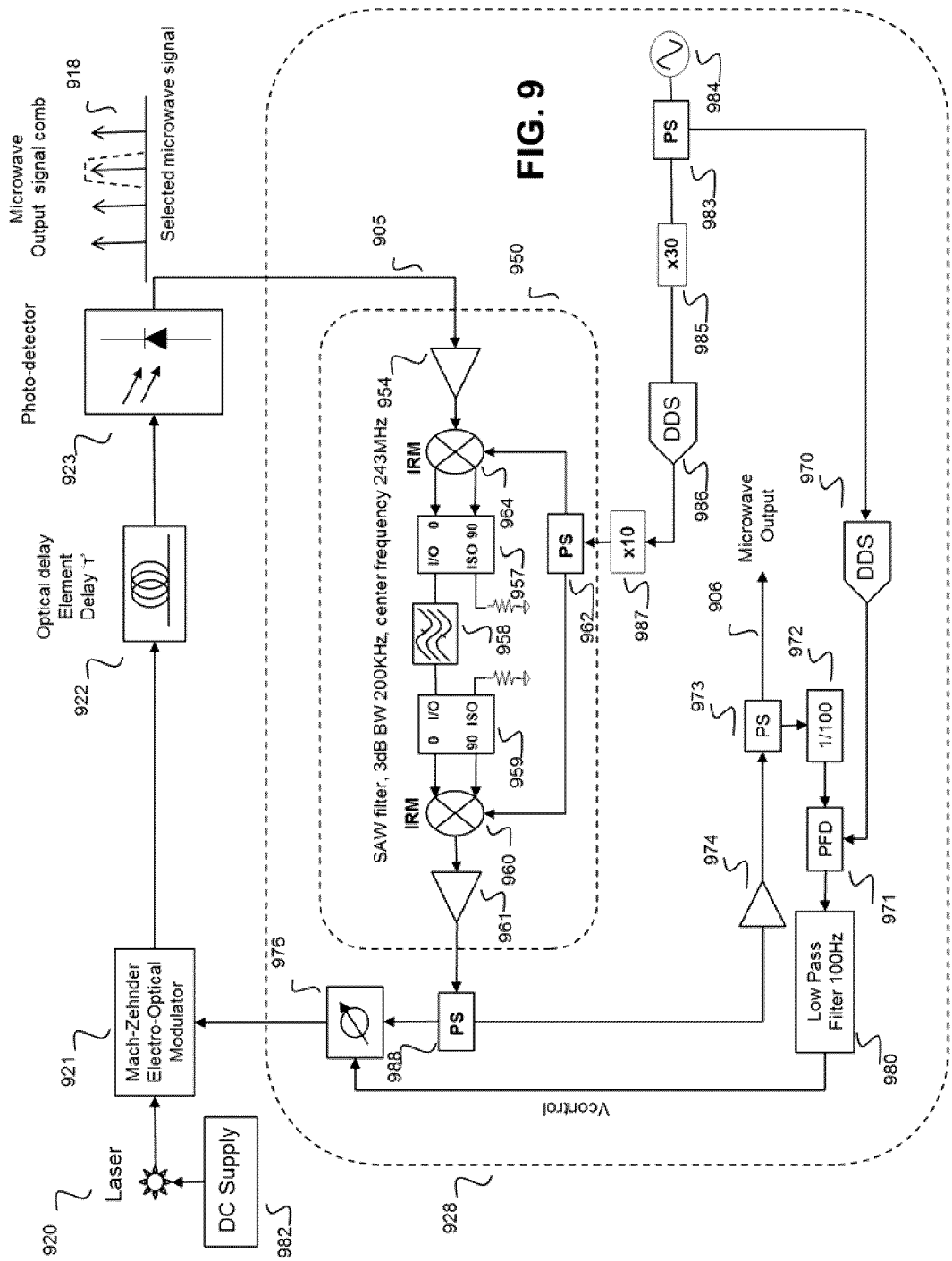
FIG. 9 illustrates a block diagram of an optoelectronic oscillator according to an embodiment of the present disclosure.

FIG. 9 illustrates a block diagram of an OEO according to an alternative embodiment of the present disclosure using a Mach-Zehnder modulator 921. Embodiments of the present disclosure include an electronically tunable filter 950. In an example embodiment, the electronically tunable filter 950 is implemented such as described in commonly assigned PCT Patent Application Publication No. WO 2014/161062 entitled "Electronically Tunable Filter", the contents of which are incorporated herein by reference.

As shown in FIG. 9, a downconverter 923 is in communication with an output of optical domain components 920, 921, 922. A set of RF domain components 928 are in communication with the output of the downconverter 923. In an example embodiment, the optical downconverter comprises a photo-detector 923. Down converted signal 905 is fed to a tunable filter 950 operating at a filter center frequency in the RF domain and having a filter passband.

The filter 950 has an output coupled to the set of optical domain components for communicating a mode selection result. In the embodiment of FIG. 9, the output of gain element 961 is communicated to optical domain component 921 via signal splitter 988 and voltage controlled phase shifter 976.

In the embodiment of FIG. 9, the downconverted signal 905 is subjected to a second downconversion to a sub-filter 958 center frequency in the RF domain and having a sub-filter passband. In an example embodiment the signal splitter 988 is a power splitter (PS).

The second downconversion in FIG. 9 can be achieved using a mixer 964, which in some embodiments is an image reject mixer, and a local oscillator which can be provided by direct digital synthesis (DDS) 986 or any synthesized source. The sub-filter 958 passband in the RF domain has a sub-filter center frequency and corresponds to the operating passband of the fixed frequency sub-filter 958. In an example embodiment, the sub-filter 958 comprises a SAW filter. The sub-filter 958 suppresses the signal level of adjacent modes. A second mixer 960 upconverts the filtered signal to a mode select output frequency band in the RF domain having a tunable filter 950 output center frequency which transposes the narrow passband of sub-filter 958 up to the target frequency and enables selection of a single oscillatory mode. In an example embodiment the tunable filter 950 output center frequency is approximately 10 GHz and the bandwidth of the sub-filter 958, which is transposed to the tunable filter 950 output, is 200 kHz. Accordingly, embodiments of the present disclosure transpose a narrow passband, for example 200 kHz, up to a target frequency, for example 10 GHz, and enables selection of a single oscillatory mode.

Embodiments of the present disclosure provide a tunable approach. The oscillator of FIG. 9 can scan across a set of modes and select a single mode from the frequency comb generated by the OEO as shown in 918. In an example embodiment, the oscillator scan is controlled by a scan controller which changes DDS 986, 970 parameters; in another example embodiment, the scan controller changes tuner parameters 985, 987, 972. In another example, embodiment the scan controller changes both DDS 986, 970 and tuner 985, 987, 972 parameters. In an example embodiment, the scan controller is implemented in a microcontroller. Alternative embodiments implement the scan controller in a computer. Further alternative embodiments implement the scan controller in test equipment.

In one embodiment of FIG. 9, fine frequency control is provided through phase lock of the RF output signal to DDS 970. Adjustment of the DDS frequency results in a phase difference between a divided version of microwave output 906 and the DDS 970 frequency. The phase difference is converted to a control voltage by the phase frequency detector 971 and fed to the voltage controlled phase shifter 976. Voltage controlled phase shifter 976 adjusts the loop phase, which in turn results in the loop frequency being adjusted to 100× the DDS 970 frequency, the 100× being determined by the output frequency divider 972. The DDS 970 can be used to accurately set the OEO feedback loop frequency. Low pass filter 980 band limits the phase noise and unwanted spurious frequency components introduced into the electro-optical loop by DDS 970. In addition to enabling fine frequency adjustment and mode to mode tuning, DDS 970 and its associated phase locked loop ensures the electro-optical loop remains phase locked to the crystal reference 984 mitigating thermal drift of the system.

Figure 10:
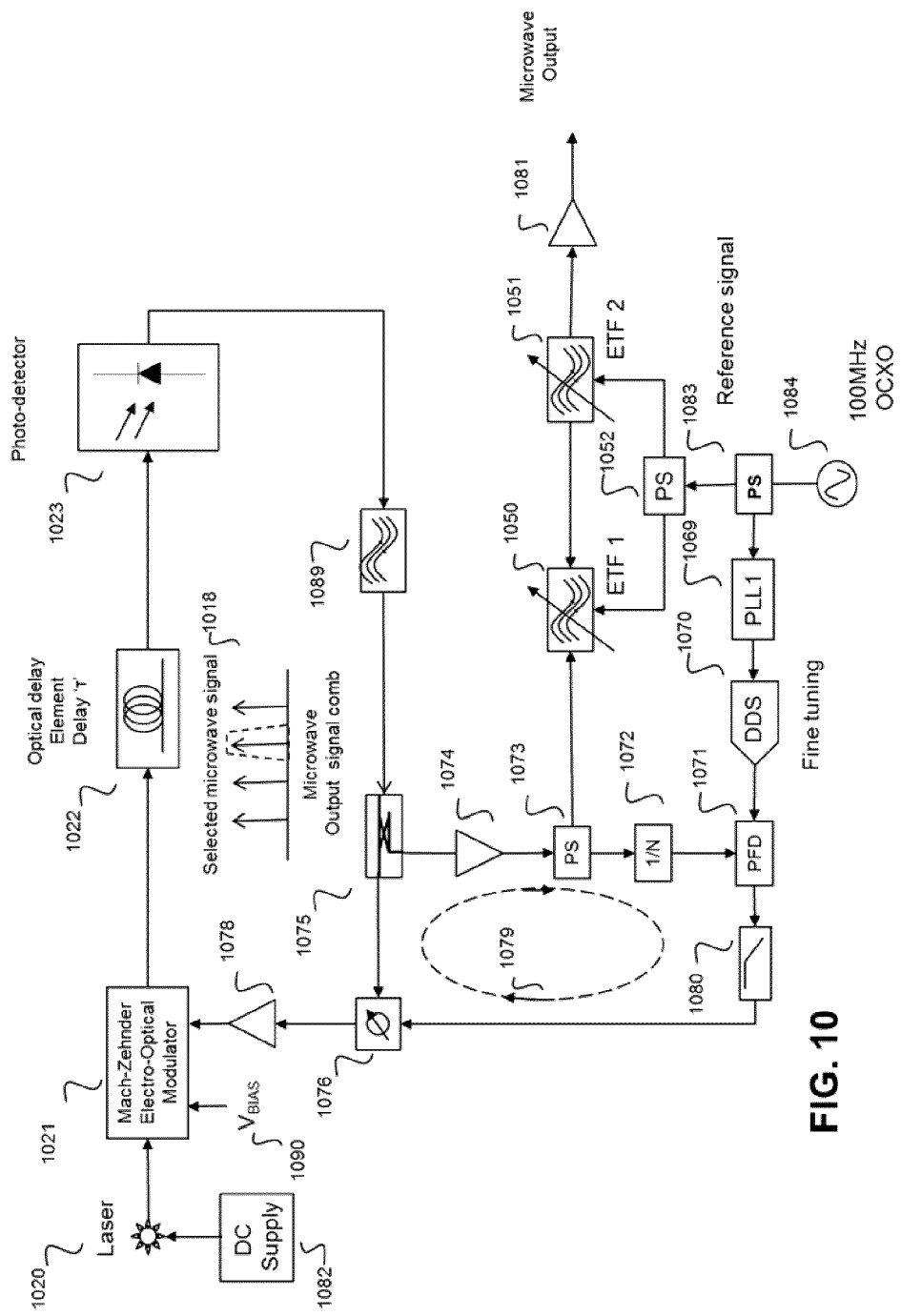
FIG. 10 illustrates a block diagram of an optoelectronic oscillator according to an embodiment of the present disclosure with cascaded dual tunable mode selection external to a feedback loop.

FIG. 10 illustrates an example embodiment of the present disclosure comprising two cascaded electronically tunable filter modules 1050 and 1051 which are external to an OEO feedback loop. This embodiment incorporates a feedback corrector indicated by loop 1079 which is locked to a tuner comprising reference oscillator 1084, splitter 1083, phase locked loop 1069 and direct digital synthesiser 1070. In an example embodiment the two tunable filter modules 1050, 1051 are connected in a parallel arrangement to provide dual mode output signals.

Figure 11:
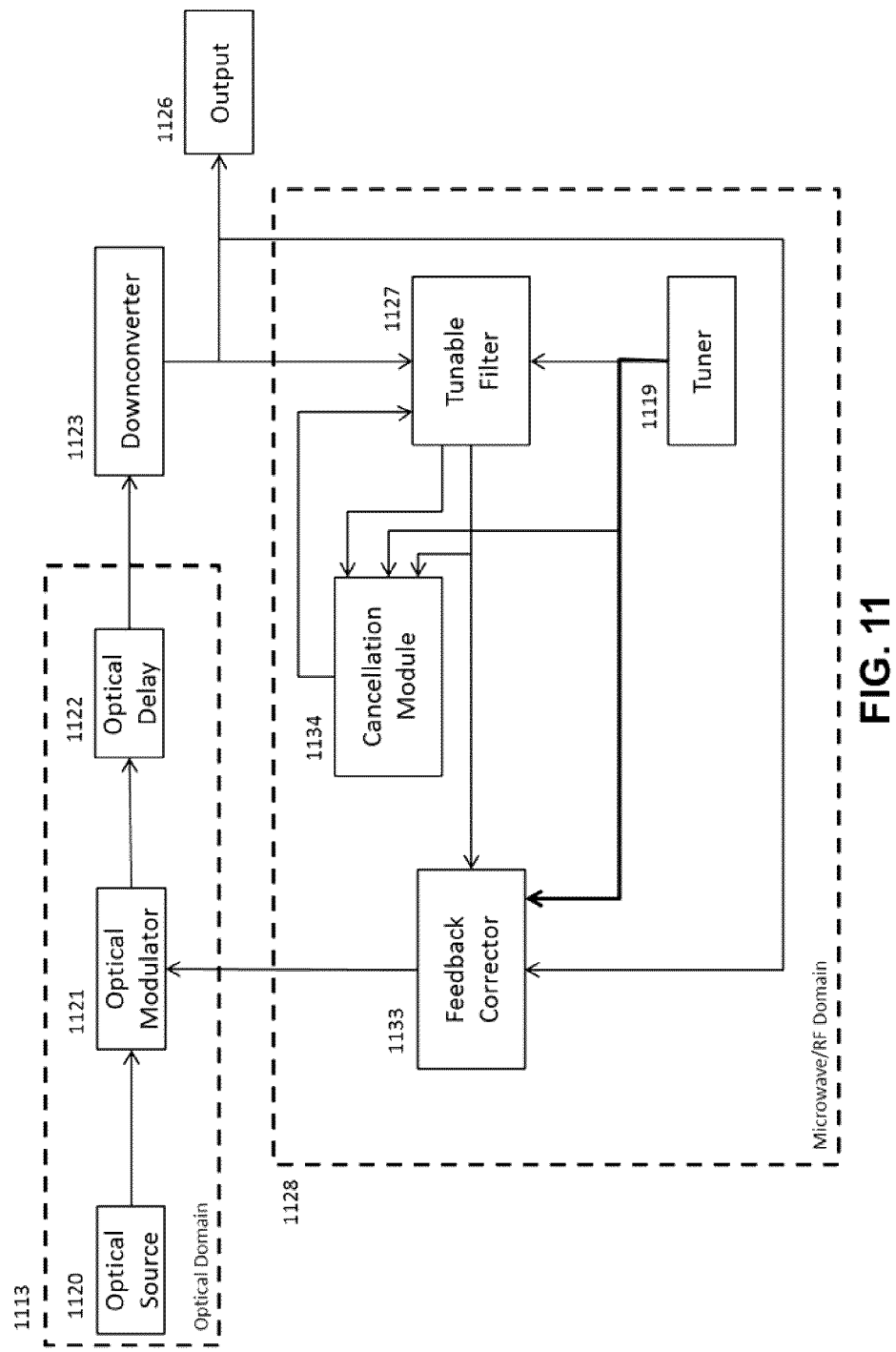
FIG. 11 illustrates a block diagram of an optoelectronic oscillator according to an embodiment of the present disclosure with improved phase noise correction.

FIG. 11 illustrates example embodiment of the present disclosure using phase noise cancellation provided by cancellation module 1134 comprising a first input coupled to the tunable filter 1127, a second input coupled to the tuner 1119 and an output coupled to the tunable filter 1127. In an example embodiment, the tunable filter 1127 introduces phase noise due to down-conversion to a sub-filter in the RF domain. The cancellation module 1134 is configured to apply a correction signal to the tunable filter 1127 such that the phase noise introduced by downconversion to the sub-filter is reduced.

Figure 12:
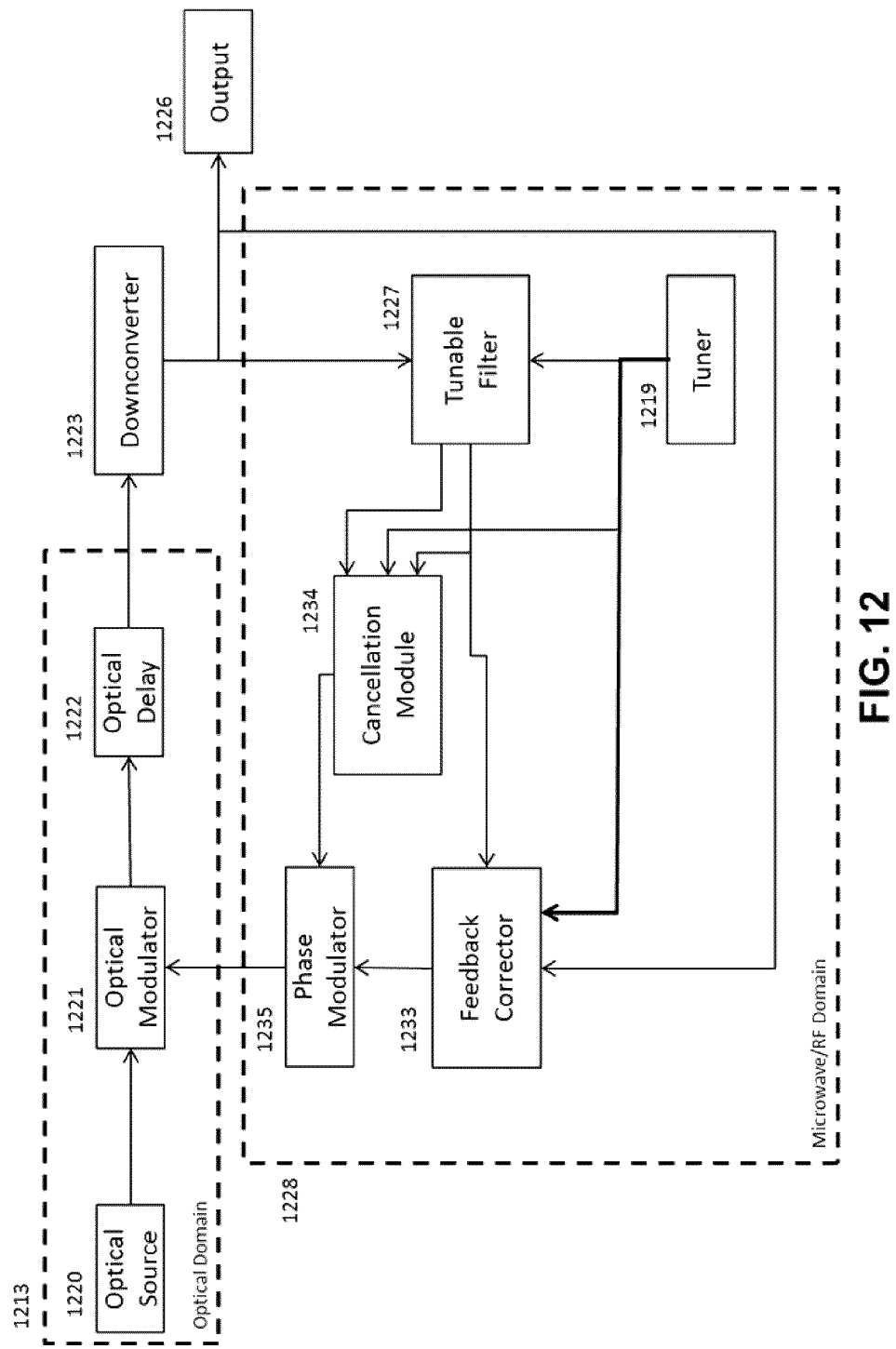
FIG. 12 illustrates a block diagram of an optoelectronic oscillator according to an embodiment of the present disclosure with alternative improved phase noise correction.

FIG. 12 illustrates an example embodiment including cancellation module 1234 comprising a first input coupled to the tunable filter 1227, a second input coupled to the tuner 1219 and an output coupled to the phase modulator 1235. The cancellation module 1234 is configured to feed a correction signal to a phase modulator 1235 such that phase noise introduced by the tunable filter 1227 is reduced.

Figure 13:
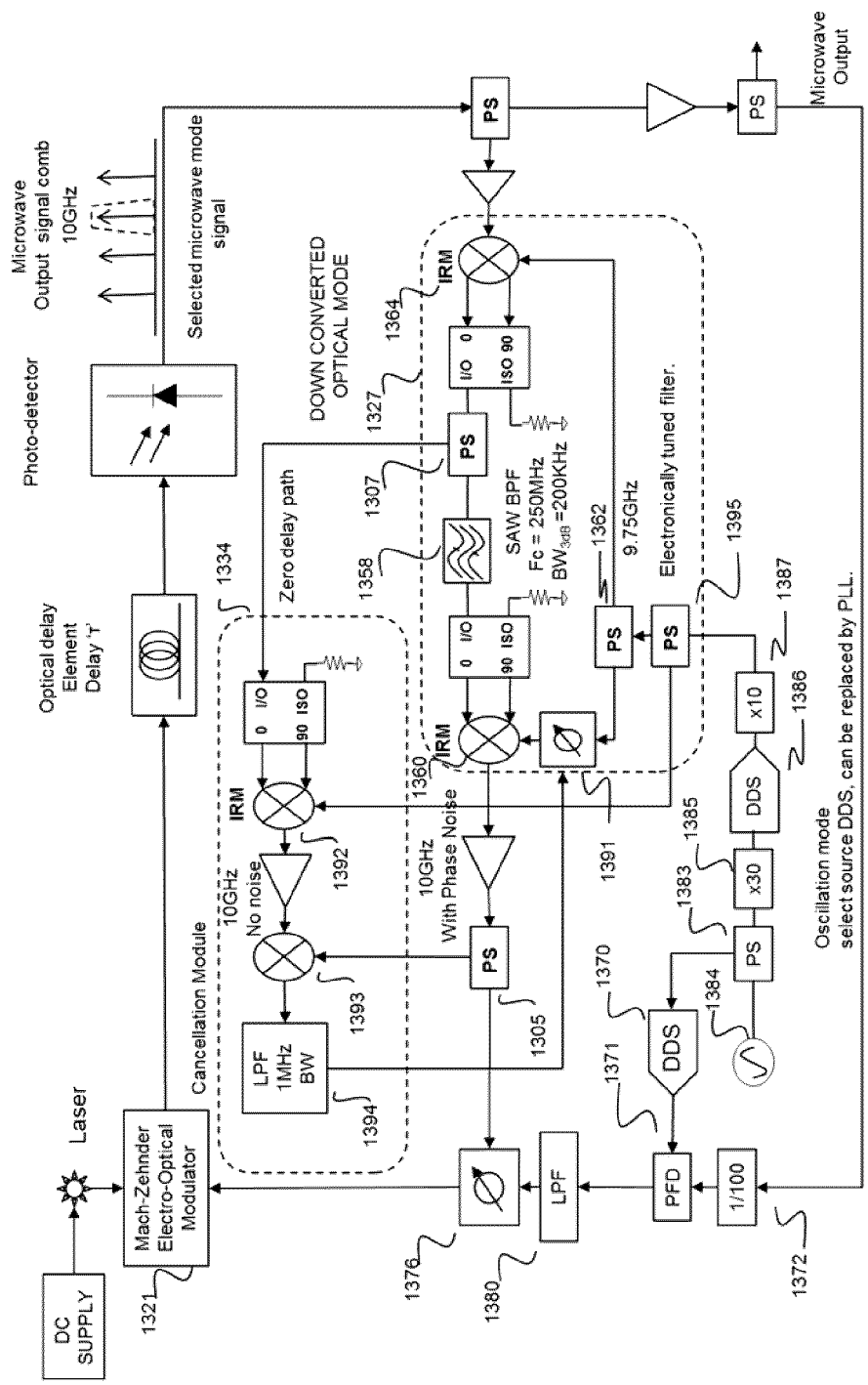
FIG. 13 illustrates a block diagram of an optoelectronic oscillator according to another embodiment of the present disclosure.

FIG. 13 illustrates an example embodiment in accordance with FIG. 11 using a Mach Zehnder Electro-optical modulator 1321. The OEO of FIG. 13 is similar to the OEO of FIG. 9, the main difference being that the cancellation module 1334 has been added. In a tunable filter 1327, operating at a filter center frequency and having an output coupled to a set of optical domain components, a source derived from reference signal 1384 is used to perform the down/up conversion to a sub-filter 1358 which provides adjacent mode suppression. The sub-filter 1358 has a delay associated with it (about 8 microseconds in some embodiments). The sub-filter 1358 delay results in the phase noise of the mode select source (1384, 1383, 1385, 1386, 1387) being applied for the down conversion, at mixer 1364, becoming de-correlated from the phase noise of the up conversion, at mixer 1360. The longer the filter delay, the lower the frequencies of the phase noise that become de-correlated. This introduces a limitation in that the mode select source phase noise is transferred to the electro-optical loop oscillation signal, limiting the phase noise of the oscillator to that of the tunable filter 1327 mode select source.

In the embodiment of FIG. 13, the cancellation module 1334 cancels the filter 1327 mode select source's phase noise. The cancellation module 1334 samples the down converted signal at a sub-filter center frequency using power splitter 1307 to provide a sampled signal. The sampled signal is up-converted by image rejection mixer 1392 back to the filter center frequency in the RF domain. The sampled signal is not filtered by the sub-filter 1358 and consequently has no sub-filter 1358 delay. The phase noise of the mode select source DDS 1386 is put on at a first mixer 1364 and taken off at a second mixer 1360; accordingly, it is as if the phase noise is not there, and this is possible because there is effectively no delay. As a result of the cancellation circuit 1334, the output of the splitter 1305 is that of the selected OEO mode with no DDS 1386 source noise.

The signal traveling through the tunable filter 1327 is delayed by the sub-filter 1358. As a result, there is a difference between the phase of the DDS 1386 source at the mixer 1360. When the RF signal of the selected RF mode passes through the cancellation module 1334 there is no delay and hence the phase noise of the optical mode select source 1386 is removed. When the selected RF mode signal goes through the sub-filter 1358, delay is introduced and the phase noise of the optical mode select source is added to the microwave mode signal at mixer 1360 following the sub-filter 1358. The OEO of FIG. 13 mixes the RF mode signal with phase noise with the RF mode signal without phase noise in mixer 1393, to the lower sideband IF signal of mixer 1393 and this IF signal is selected by the low pass filter 1394. The lower sideband IF signal is the noise voltage associated with the de-correlated phase noise of the mode select source. This noise voltage is fed back to a voltage controlled phase shifter 1391, which then cancels the phase error introduced by the de-correlation of the mode selection source. In some embodiments the sub-filter 1358 is a SAW filter having a delay of approximately 8 microseconds.

The selected oscillator mode passes through a second voltage controlled phase shifter 1376. The voltage controlled phase shifter 1376 is used to establish a phase lock between a divided version of the RF output signal and the reference signal DDS 1370. A divided version of the microwave output signal is provided by component 1372 and in this example embodiment the divide ratio is set to 100. The voltage controlled phase shifter 1376 control signal provided by filter 1380 is such that the optoelectronic modulator feedback loop is phase locked to the reference 1384. In some embodiments the reference 1384 is a crystal reference having a frequency of 100 MHz. A phase error between the set frequency at DDS 1370 and the divided RF output frequency at the output of divider 1372, will adjust the phase shifter 1376 and phase lock the loop to a frequency equal to 100 times DDS 1370. The DDS 1370 enables fine frequency adjustment of the microwave output signal. In an example embodiment, the fine frequency adjustment has a step size of 1 Hz. Noise and spurious of the DDS 1370 is limited to the bandwidth of the reference control loop low pass filter (LPF) 1380. In an example embodiment, the bandwidth of the reference control loop filter 1380 is 100 Hz.

Figure 14:
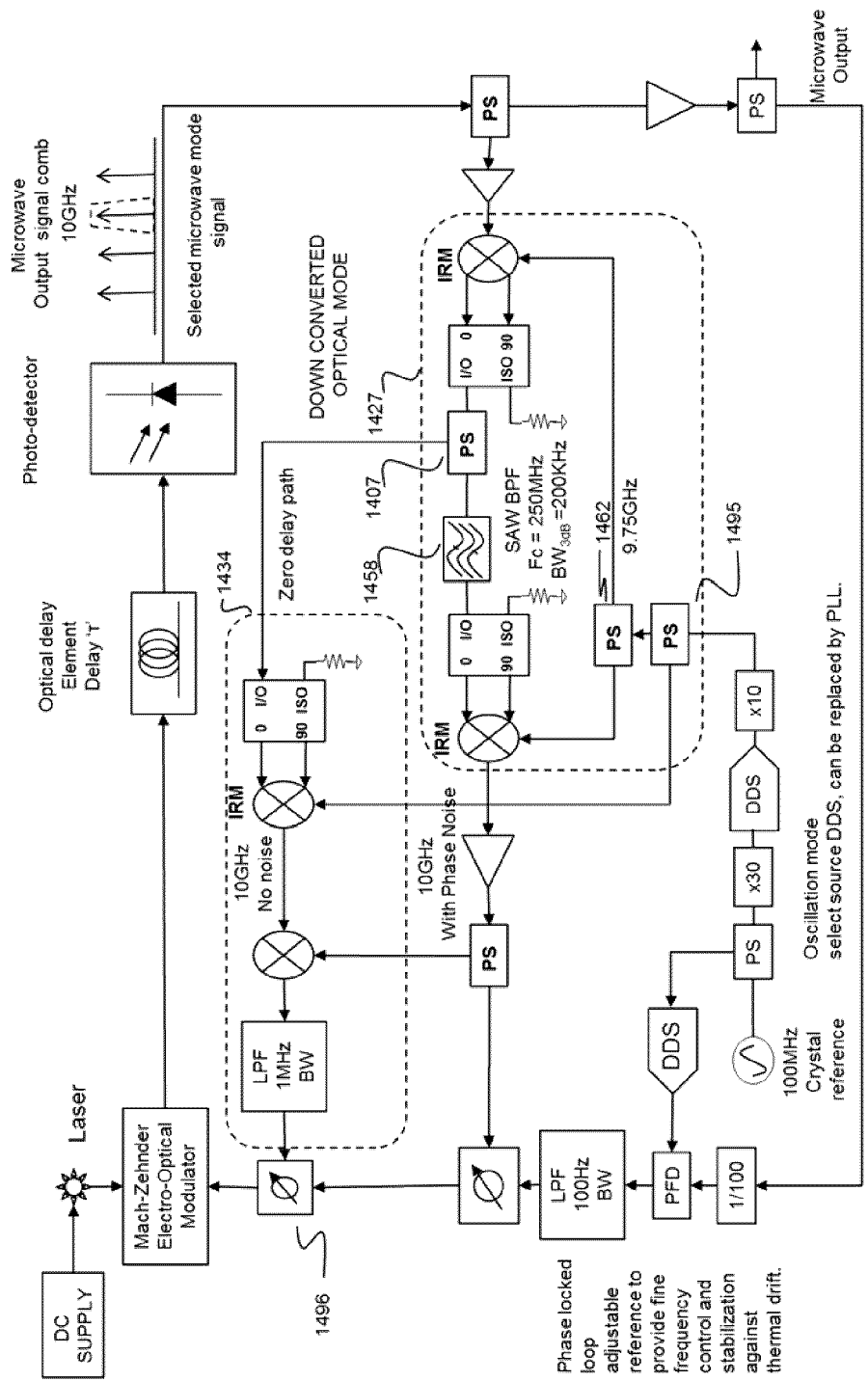
FIG. 14 illustrates a block diagram of an optoelectronic oscillator according to an embodiment of the present disclosure with detail on phase noise correction.

FIG. 14 illustrates an example embodiment in accordance with FIG. 12 where the RF domain components further comprise a cancellation module 1434. The cancellation module 1434 is used cancel the mode selection source phase noise directly in the OEO feedback loop by applying a correction signal to phase modulator 1496. This is in contrast to the configuration of the cancellation module in FIG. 13 where the cancellation module output is applied to the tunable mode selection filter 1427. The use of the cancellation module 1434 according to the embodiment of FIG. 14 has the benefit of inherent stability and, as such, in certain implementations proves advantageous with respect to the OEO feedback loop.

Figure 15:
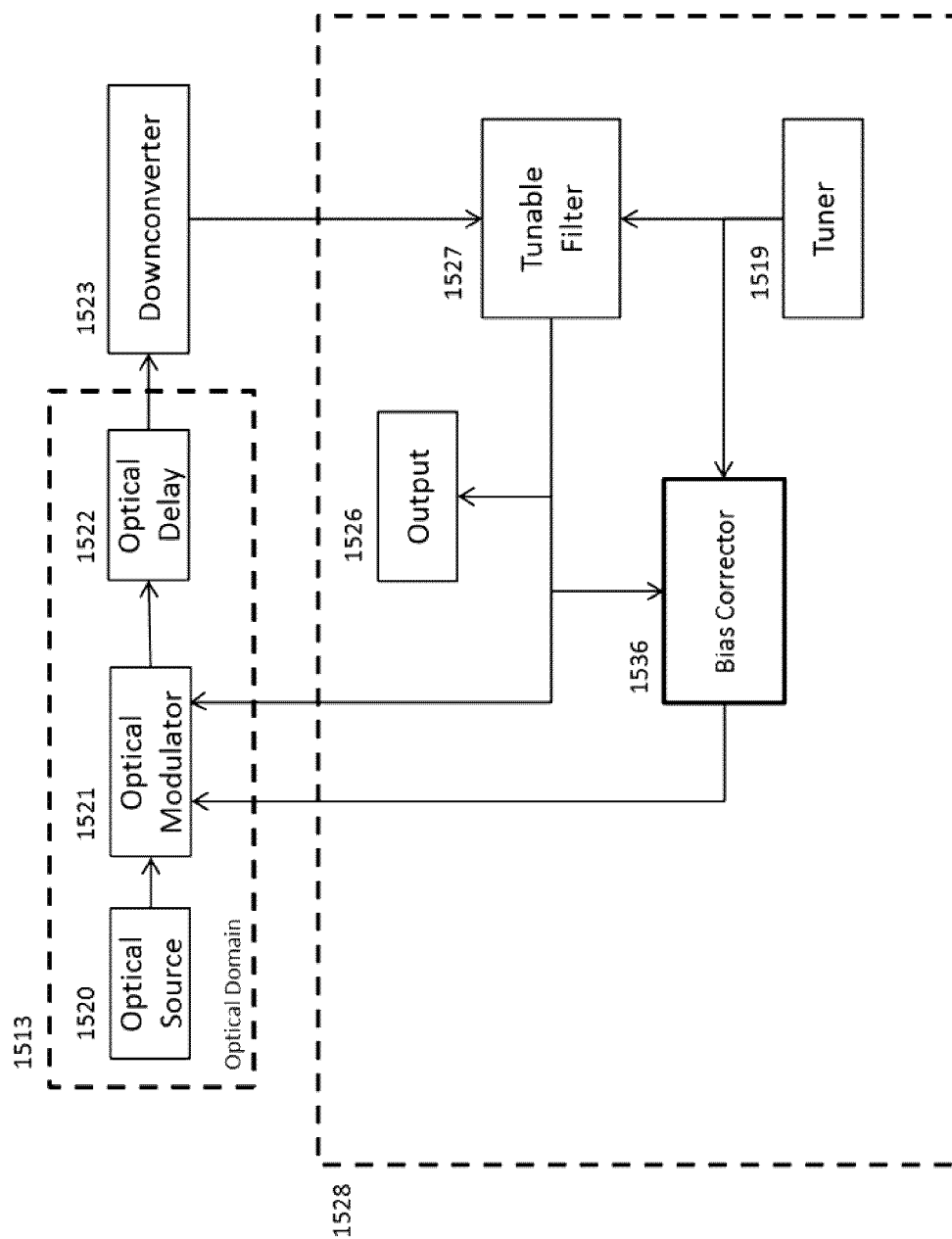
FIG. 15 illustrates a block diagram of an optoelectronic oscillator according to an embodiment of the present disclosure with bias modulation.

FIG. 15 illustrates an example embodiment which further includes and incorporates bias corrector 1536 into the RF domain components 1528. The RF domain components comprise a feedback loop comprising the tunable filter 1527 and a bias feedback loop comprising a bias corrector 1536. The bias corrector 1536 is configured to modulate the dc bias circuitry of the optical modulator 1521 such that the phase of the optically modulated signal is modulated in sympathy with the modulated bias signal output of the bias corrector 1536. This modulated bias signal is obtained by comparing the tuner 1519 reference signal to the output of the tunable filter 1527, the difference being proportional to the phase noise introduced by the tunable filter 1527.

Figure 16:
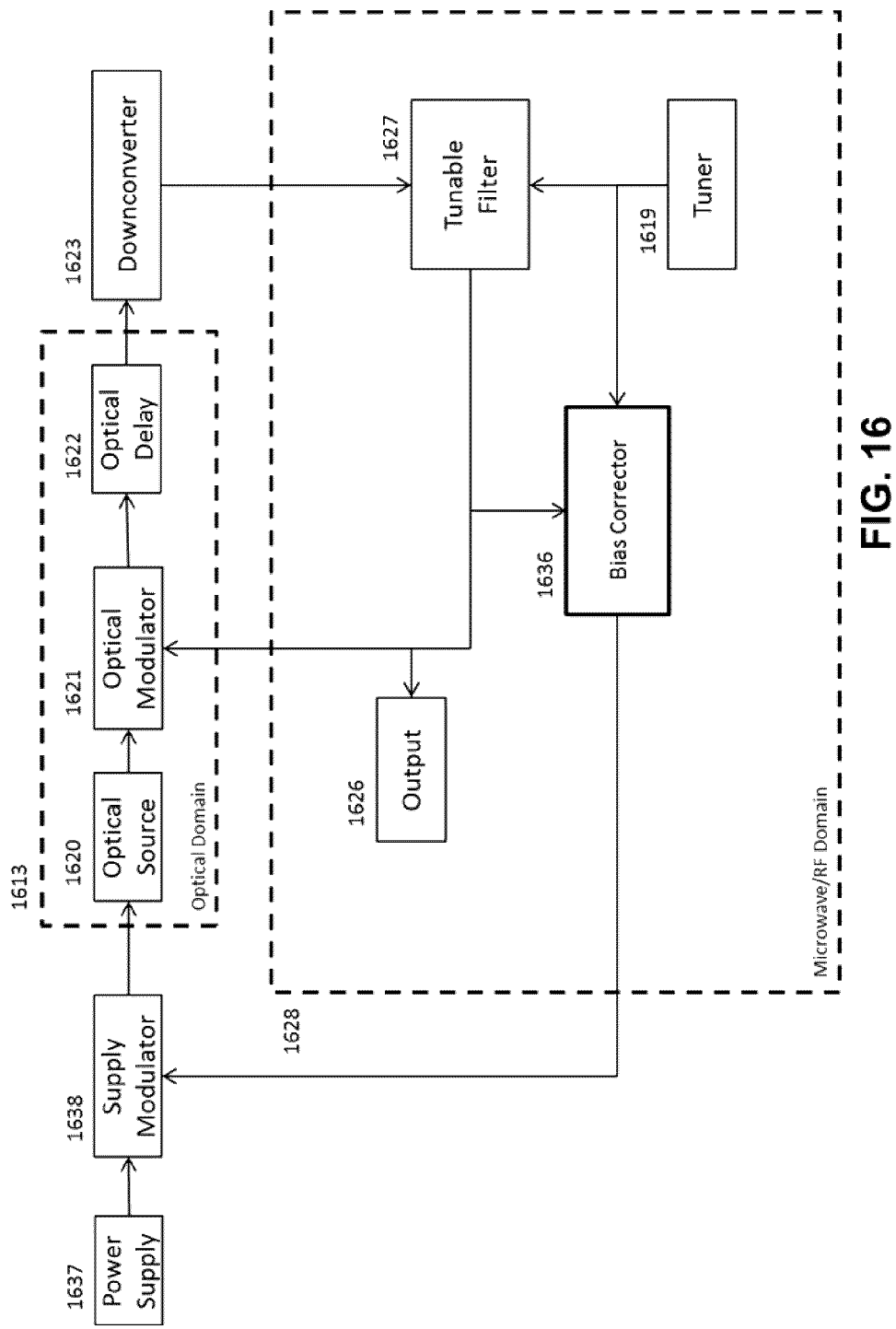
FIG. 16 illustrates a block diagram of an optoelectronic oscillator according to an embodiment of the present disclosure with alternative bias modulation.

FIG. 16 illustrates an example embodiment of the present disclosure which further includes and incorporates a bias corrector 1636 into the RF domain components 1628. The RF domain components comprise a feedback loop comprising the tunable filter 1627 and a bias feedback loop comprising a bias corrector 1636 and a supply modulator 1638. The bias corrector is configured to stimulate an optical source supply modulator 1638 such that the phase of the optical source is modulated in sympathy with the modulated bias signal output of the bias corrector 1636. This modulated bias signal is obtained by comparing the tuner 1619 reference signal to the output of the tunable filter 1627, the difference being proportional to the phase noise introduced by the tunable filter 1627.

Figure 17:
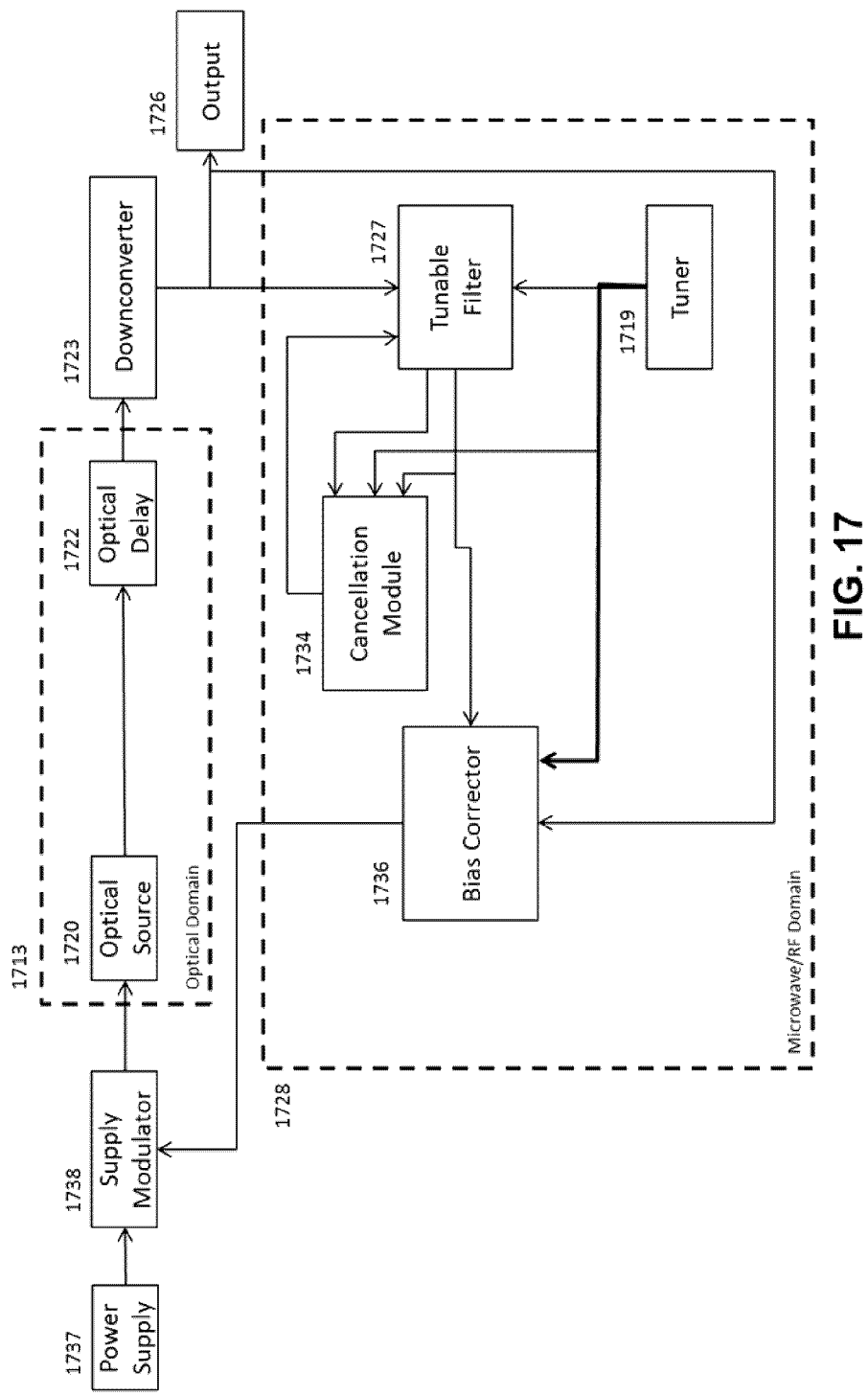
FIG. 17 illustrates a block diagram of an optoelectronic oscillator according to an embodiment of the present disclosure with bias modulation and phase cancellation.

FIG. 17 illustrates an example embodiment which incorporates a bias corrector 1736 and cancellation module 1734 into the RF domain components 1728. In contrast to FIG. 16 where an OEO feedback loop is used to modulate an optical modulator 1621, the example embodiment of FIG. 17 removes the need for an optical modulator by introducing a cancellation module 1734. The cancellation module 1734 modulates the output of the tunable filter 1727 such that the OEO phase noise is reduced.

Figure 18:
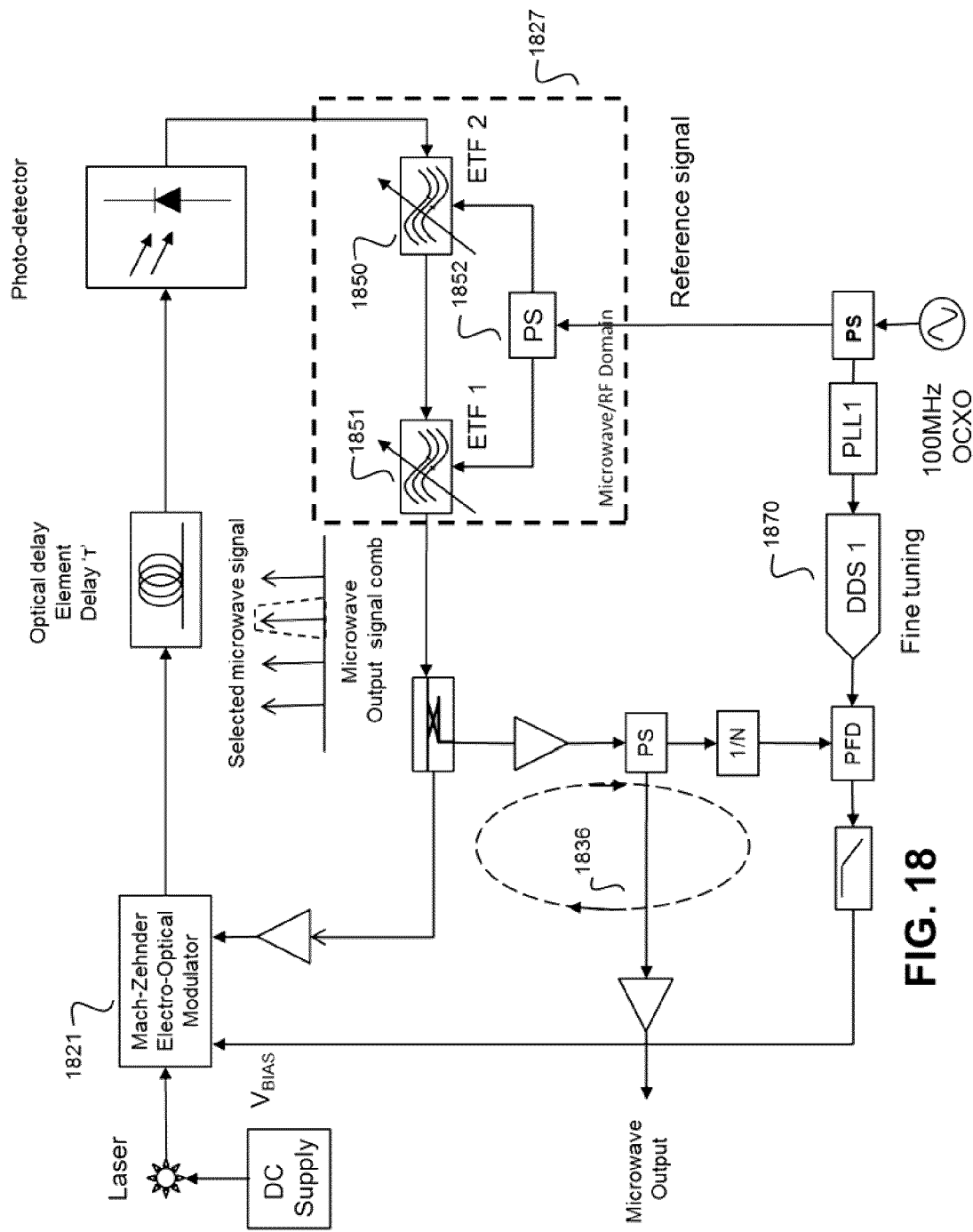
FIG. 18 illustrates a block diagram of an optoelectronic oscillator according to a further embodiment of the present disclosure.

FIG. 18 illustrates an example embodiment in accordance with FIG. 15 which incorporates cascaded tunable filter modules 1850, 1851. The two electronically tunable filter modules 1850, 1851 have center frequencies which may be offset such that the tunable filter module passbands overlap such that the cascaded bandwidth of the tunable filter 1827 is capable of isolating a single OEO mode from a plurality of tightly spaced modes. In some embodiments the tightly spaced modes are separated by approximately 200 kHz. In other embodiments the isolated mode is centered at approximately 10 GHz. In an example embodiment the two tunable filter modules 1850, 1851 are connected in a parallel arrangement.

Figure 19:
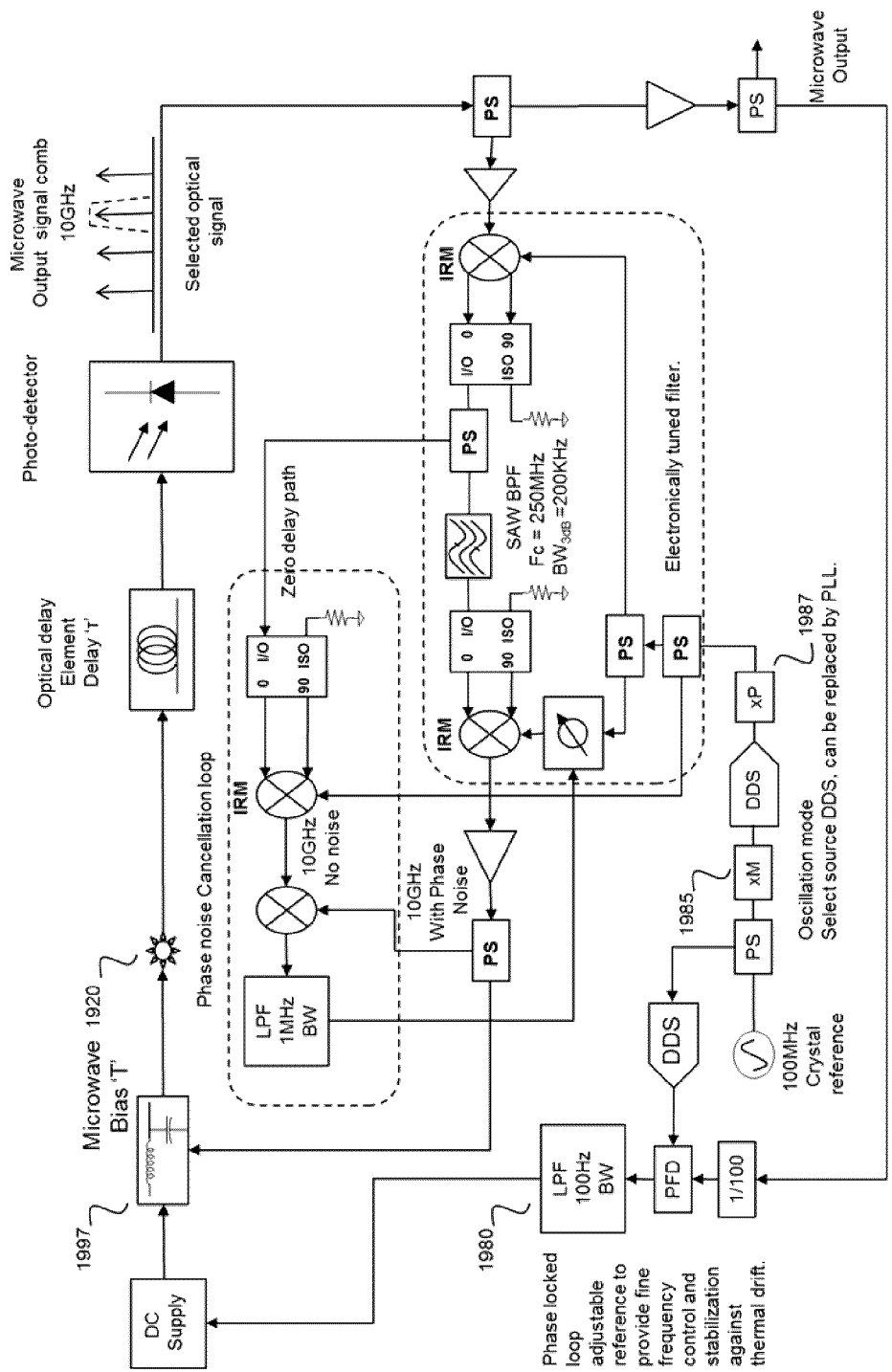
FIG. 19 illustrates a block diagram of an optoelectronic oscillator according to an embodiment of the present disclosure with increased detail of bias modulation and phase cancellation.

In FIG. 19, an RF signal is applied using bias 'T' 1997 to the laser diode in addition to the applied DC bias; the RF signal modulates the biasing current of the laser 1920, resulting in intensity modulation sidebands. A low frequency control loop is formed through control of the DC supply current the control loop 1980. The oscillation mode select source DDS frequency multipliers 1985, 1987 have been generalized to M and P where in a specific embodiment these would be ×30 and '10 respectively. FIG. 19 can be described as a tunable opto-electronic oscillator loop comprising a feedback phase noise cancellation loop and laser bias modulation.

Figure 20:
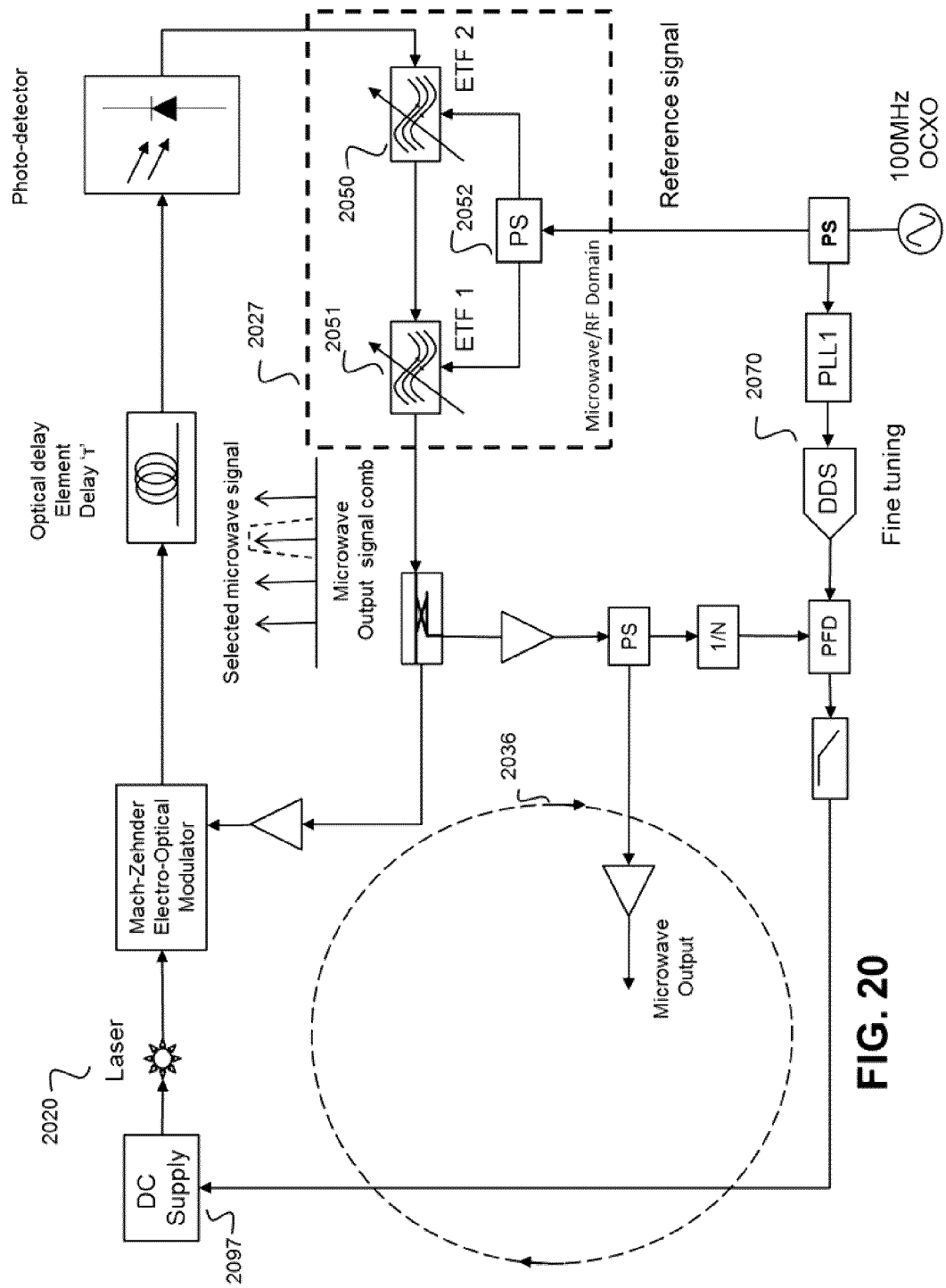
FIG. 20 illustrates a block diagram of an optoelectronic oscillator according to an embodiment of the present disclosure with cascaded dual tunable mode selection and bias modulation.

FIG. 20 illustrates an example embodiment of the present disclosure which incorporates an OEO feedback bias modulator indicated by loop 2036 which is configured to modulate the bias supply 2097, which provides power to the laser 2020, such that the frequency of the laser output has low phase noise. The bias signal applied to the DC supply 2097 is obtained by comparing the DDS 2070 output signal to the output of tunable filter 2027. The error signal is used to phase lock the OEO to N times the DDS 2070 frequency over the bandwidth of the control loop. Adjustment of the DDS 2070 output frequency enables fine frequency control of the resultant OEO enabling mode to mode tunability and also results in phase lock of the OEO to the system reference oscillator. The embodiment shown in FIG. 20 has a tunable cascade filter 2027 comprising a first tunable filter module 2050, a second tunable filter module 2051 and a splitter 2052. In an example embodiment the tunable filter 2027 comprises at least one sub-filter. In an example embodiment, the first and second tunable filter modules 2050, 2051 are configured to have overlapping passbands such that the bandwidth of the passband of the tunable mode selection filter is significantly less than the bandwidth of the passbands of the first and second tunable filters 2050, 2051. In an example embodiment the two tunable filters 2050, 2051 are connected in a parallel arrangement.

An optoelectronic oscillator according to an embodiment of the present disclosure exceeds the performance of existing opto-electronic oscillators in one or more of the following three areas: an OEO according to an embodiment of the present disclosure is continuously tunable; an OEO according to an embodiment of the present disclosure enables phase lock to a thermally stable reference oscillator enabling compensation for thermally induced laser frequency drift; an OEO according to an embodiment of the present disclosure employs a new wideband DDS controlled tunable filter with high finesse that enables oscillator mode selection and continuous frequency tuning.

In an example embodiment of the present disclosure, a single fiber spool of a minimum of 1 km in length is employed as the optical delay line element. In this example, the fiber is excited by a laser diode the output of which is either bias modulated via a microwave bias 'T' or optically modulated using a conventional Mach-Zehnder electro-optical modulator. The output of the fiber spool is fed to a photo-detector. The bandwidth of the photo-detector, RF feedback circuitry and modulator circuits determine the ultimate RF signal bandwidth.

In an example embodiment, the photo-detector operates to downconvert the optical signal to the RF frequency band. RF gain elements then ensure that there is sufficient loop gain to compensate for the loss introduced by the RF and optical components.

In an example embodiment, the electro-optical loop oscillates at all frequencies for which the electro-optical loop phase shift is an integer multiple of $2\pi$ and there is more gain than loss.

An optoelectronic oscillator according to an embodiment of the present disclosure incorporates an electronic filter that transposes the narrow pass band characteristics of a SAW filter to a RF frequency for the purpose of mode selection. The use of image rejection mixers for the transposition results in a single pass band characteristic.

An optoelectronic oscillator according to an embodiment of the present disclosure incorporates a phase noise cancellation loop which suppresses the electronic filter phase noise that results from decorrelation of the source by the time delay of a fixed low frequency SAW filter.

An optoelectronic oscillator according to an embodiment of the present disclosure employs a control loop which stabilizes the OEO output against thermally induced variation in the laser through means of a phase lock to a stable crystal reference.

In an example embodiment, the reference for the phase lock of the opto-electronic loop is a DDS, thus the loop can be accurately centered in frequency and tuned between loop modes, resulting in a true continuous tuning bandwidth.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

In the foregoing the term components has been used to identify the various blocks of the figures contained in the present disclosure. Components in this context does not signify the smallest individual element of any particular block. A component could signify an individual element such as a resistor, a sub-module, a module, a system or any other abstract term for an element or elements comprising an OEO.

In the foregoing the term microwave frequency and radio frequency are used to denote operating frequencies of the microwave domain components. It will be apparent to one skilled in the art that these operating frequencies can be in a wide range including 1 MHz to 100 GHz, but not excluding frequencies outside this range.

The above-described embodiments are intended to be examples only. Alterations, modifications and variations can be effected to the particular embodiments by those of skill in the art without departing from the scope, which is defined solely by the claims appended hereto.

What is claimed is:

1. An optoelectronic oscillator (OEO) comprising:
a set of optical domain components;
a downconverter in communication with an output of the optical domain components; and
a set of radio frequency (RF) domain components in communication with an output of the downconverter, the set of RF domain components comprising:
a tunable filter operating at a filter center frequency and having an output coupled to the set of optical domain components for communicating a mode selection result, the tunable filter including:
a tuner; and
a fixed frequency sub-filter operating at a sub-filter center frequency to provide mode selection and adjacent mode suppression with respect to the tunable filter center frequency, the sub-filter center frequency being lower than the tunable filter center frequency, and a ratio of the tunable filter center frequency to a bandwidth of the sub-filter being at least 1000:1.

2. The optoelectronic oscillator (OEO) of claim 1 wherein the tunable filter output is coupled to the set of optical domain components for communicating the mode selection result via a modulator.

3. The optoelectronic oscillator (OEO) of claim 1 wherein the sub-filter comprises a resonator or filter having an adjacent mode suppression characteristic providing about 50 dB to about 60 dB of adjacent mode suppression.

4. The optoelectronic oscillator (OEO) of claim 1 wherein the sub-filter comprises a surface acoustic wave (SAW) filter.

5. The optoelectronic oscillator (OEO) of claim 1 wherein the sub-filter is selected from the group consisting of: a dielectric resonator filter, an air filled cavity filter, and a whispering gallery mode resonator filter.

6. The optoelectronic oscillator (OEO) of claim 1 wherein the tunable filter further comprises a first tunable filter module and a second tunable filter module.

7. The optoelectronic oscillator (OEO) of claim 6 wherein the first tunable filter module and second tunable filter module are configured in a cascade arrangement.

8. The optoelectronic oscillator (OEO) of claim 6 wherein the first tunable filter module and the second tunable filter module are configured in a parallel arrangement.

9. The optoelectronic oscillator (OEO) of claim 6 wherein the first tunable filter module and second tunable filter module have different passband bandwidths.

10. The optoelectronic oscillator (OEO) of claim 7 wherein the first tunable filter module and second tunable filter module have overlapping passbands.

11. The optoelectronic oscillator (OEO) of claim 8 wherein the first tunable filter module and second tunable filter module have non-overlapping passbands.

12. The optoelectronic oscillator (OEO) of claim 6 wherein:
the first tunable filter module comprises the tuner and the sub-filter; and
the second tunable filter module comprises a second tuner and a second sub-filter.

13. The optoelectronic oscillator (OEO) of claim 1 wherein the RF domain components further comprise a feedback corrector, the feedback corrector including:
a phase modulator;
a first input coupled to the tuner,
a second input coupled to the tunable filter, and
an output coupled to the optical domain components.

14. The optoelectronic oscillator (OEO) of claim 13 wherein the phase modulator couples the tunable filter to the optical domain components.

15. The optoelectronic oscillator (OEO) of claim 13, wherein the tunable filter comprises:
a down-conversion mixer;
an up-conversion mixer, where the sub-filter is coupled to an output of the down-conversion mixer and to a first input of the up-conversion mixer; and
a compensating sub-filter coupled to a second input of the up-conversion mixer for providing a delay to a reference signal to the up-conversion mixer to compensate for a delay time provided by the sub-filter disposed between the down-conversion mixer and the up-conversion mixer.

16. The optoelectronic oscillator (OEO) of claim 13 further comprising a cancellation module comprising a first input coupled to the tunable filter, a second input coupled to the tuner and an output coupled to the tunable filter.

17. The optoelectronic oscillator (OEO) of claim 13 further comprising a cancellation module comprising a first input coupled to the tunable filter, a second input coupled to the tuner and an output coupled to the phase modulator.

18. The optoelectronic oscillator (OEO) of claim 1 wherein the RF domain components further comprise a feedback loop comprising the tunable filter and a bias feedback loop comprising a bias corrector and a supply modulator.

19. The optoelectronic oscillator (OEO) of claim 1 wherein the tuner is operable over at least an octave of frequency.

20. The optoelectronic oscillator (OEO) of claim 1 wherein the optical domain components comprise an optical delay.

21. The optoelectronic oscillator (OEO) of claim 20 wherein the optical delay is a single optical fibre.

* * * * *